(12) United States Patent
Shibazaki

(10) Patent No.: US 8,164,736 B2
(45) Date of Patent: Apr. 24, 2012

(54) EXPOSURE METHOD, EXPOSURE APPARATUS, AND METHOD FOR PRODUCING DEVICE

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 987 days.

(21) Appl. No.: 12/153,885

(22) Filed: May 27, 2008

(65) Prior Publication Data
US 2008/0297751 A1 Dec. 4, 2008

Related U.S. Application Data

(60) Provisional application No. 60/924,710, filed on May 29, 2007.

(51) Int. Cl.
*G03B 27/42* (2006.01)
*G03B 27/68* (2006.01)
*G01B 11/00* (2006.01)

(52) U.S. Cl. ............... 355/53; 355/52; 356/401

(58) Field of Classification Search .......... 355/53, 355/77, 30; 356/399, 400, 401
See application file for complete search history.

(56) References Cited

U.S. PATENT DOCUMENTS

| | | | |
|---|---|---|---|
| 4,346,164 A | 8/1982 | Tabarelli et al. |
| 4,480,910 A | 11/1984 | Takanashi et al. |
| 4,780,617 A | 10/1988 | Umatate et al. |
| 5,151,750 A | 9/1992 | Magome et al. |
| 5,448,332 A | 9/1995 | Sakakibara et al. |
| 5,610,683 A | 3/1997 | Takahashi |
| 5,715,039 A | 2/1998 | Fukuda et al. |
| 5,815,246 A | 9/1998 | Sperling et al. |
| 5,825,043 A | 10/1998 | Suwa |
| 5,969,081 A | 10/1999 | Kim et al. |
| 5,969,441 A | 10/1999 | Loopstra et al. |
| 6,208,407 B1 | 3/2001 | Loopstra |
| 6,341,007 B1 | 1/2002 | Nishi et al. |
| 6,351,041 B1 | 2/2002 | Okubo |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,611,316 B2 | 8/2003 | Sewell |
| 6,674,510 B1 | 1/2004 | Jasper et al. |

(Continued)

FOREIGN PATENT DOCUMENTS

DE 221 563 A1 4/1985

(Continued)

OTHER PUBLICATIONS

Mar. 18, 2009 International Search Report issued in PCT/JP2008/060255.

(Continued)

*Primary Examiner* — Peter B Kim
(74) *Attorney, Agent, or Firm* — Oliff & Berridge, PLC

(57) ABSTRACT

An exposure method includes measuring coordinates of alignment marks before and after exposing a first wafer to determine a fluctuation amount of a parameter of the alignment; measuring coordinates of alignment marks before exposing a second wafer to determine a parameter of the alignment; and aligning and exposing the second wafer based on a parameter obtained by correcting the parameter with the fluctuation amount determined for the first wafer. A high overlay accuracy can be obtained even when the alignment information is gradually changed, for example, due to the linear expansion and contraction of the substrate during the exposure of the substrate.

72 Claims, 16 Drawing Sheets

U.S. PATENT DOCUMENTS

| | | |
|---|---|---|
| 6,710,849 B2 | 3/2004 | Kwan et al. |
| 6,778,257 B2 | 8/2004 | Bleeker et al. |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,268,845 B2 | 9/2007 | Oizumi |
| 7,375,796 B2 * | 5/2008 | Baselmans et al. ............. 355/53 |
| 2002/0041377 A1 | 4/2002 | Hagiwara et al. |
| 2003/0025890 A1 * | 2/2003 | Nishinaga ........................ 355/53 |
| 2003/0081193 A1 | 5/2003 | White et al. |
| 2004/0165159 A1 | 8/2004 | Lof et al. |
| 2005/0052632 A1 * | 3/2005 | Miyajima ........................ 355/53 |
| 2005/0099628 A1 * | 5/2005 | Kokumai ........................ 356/401 |
| 2005/0259234 A1 | 11/2005 | Hirukawa et al. |
| 2005/0280791 A1 | 12/2005 | Nagasaka et al. |
| 2006/0119820 A1 | 6/2006 | Hirukawa |
| 2006/0227309 A1 | 10/2006 | Loopstra et al. |
| 2006/0231206 A1 | 10/2006 | Nagasaka et al. |
| 2007/0288121 A1 | 12/2007 | Shibazaki |
| 2008/0084546 A1 | 4/2008 | Owa et al. |
| 2008/0088843 A1 | 4/2008 | Shibazaki |

FOREIGN PATENT DOCUMENTS

| | | |
|---|---|---|
| DE | 224 448 A1 | 7/1985 |
| EP | 1 420 298 A2 | 5/2004 |
| EP | 1 477 857 A1 | 11/2004 |
| EP | 1 713 113 A1 | 10/2006 |
| JP | A-58-202448 | 11/1983 |
| JP | A-59-019912 | 2/1984 |
| JP | A-61-44429 | 3/1986 |
| JP | A-62-065326 | 3/1987 |
| JP | A-63-157419 | 6/1988 |
| JP | A-02-272305 | 11/1990 |
| JP | A-04-305915 | 10/1992 |
| JP | A-04-305917 | 10/1992 |
| JP | A-05-062877 | 3/1993 |
| JP | A-05-343289 | 12/1993 |
| JP | A-06-124873 | 5/1994 |
| JP | A-06-283403 | 10/1994 |
| JP | A-07-220990 | 8/1995 |
| JP | A-08-313842 | 11/1996 |
| JP | A-08-316125 | 11/1996 |
| JP | A-10-303114 | 11/1998 |
| JP | A-10-340846 | 12/1998 |
| JP | A-11-176727 | 7/1999 |
| JP | A-2000-058436 | 2/2000 |
| JP | A-2001-313250 | 11/2001 |
| JP | A-2002-014005 | 1/2002 |
| JP | A-2004-304135 | 10/2004 |
| WO | WO 99/23692 A1 | 5/1999 |
| WO | WO 99/49504 A1 | 9/1999 |
| WO | WO 01/35168 A1 | 5/2001 |
| WO | WO 03/065428 | 8/2003 |
| WO | WO 2004/019128 A2 | 3/2004 |
| WO | WO 2004/053955 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2005/024517 A2 | 3/2005 |
| WO | WO 2006/013806 A1 | 2/2006 |
| WO | WO 2006/038952 A2 | 4/2006 |
| WO | WO 2007/083758 A1 | 7/2007 |
| WO | WO 2007/097379 A1 | 8/2007 |

OTHER PUBLICATIONS

Mar. 18, 2009 PCT Written Opinion issued in PCT/JP2008/060255.

* cited by examiner

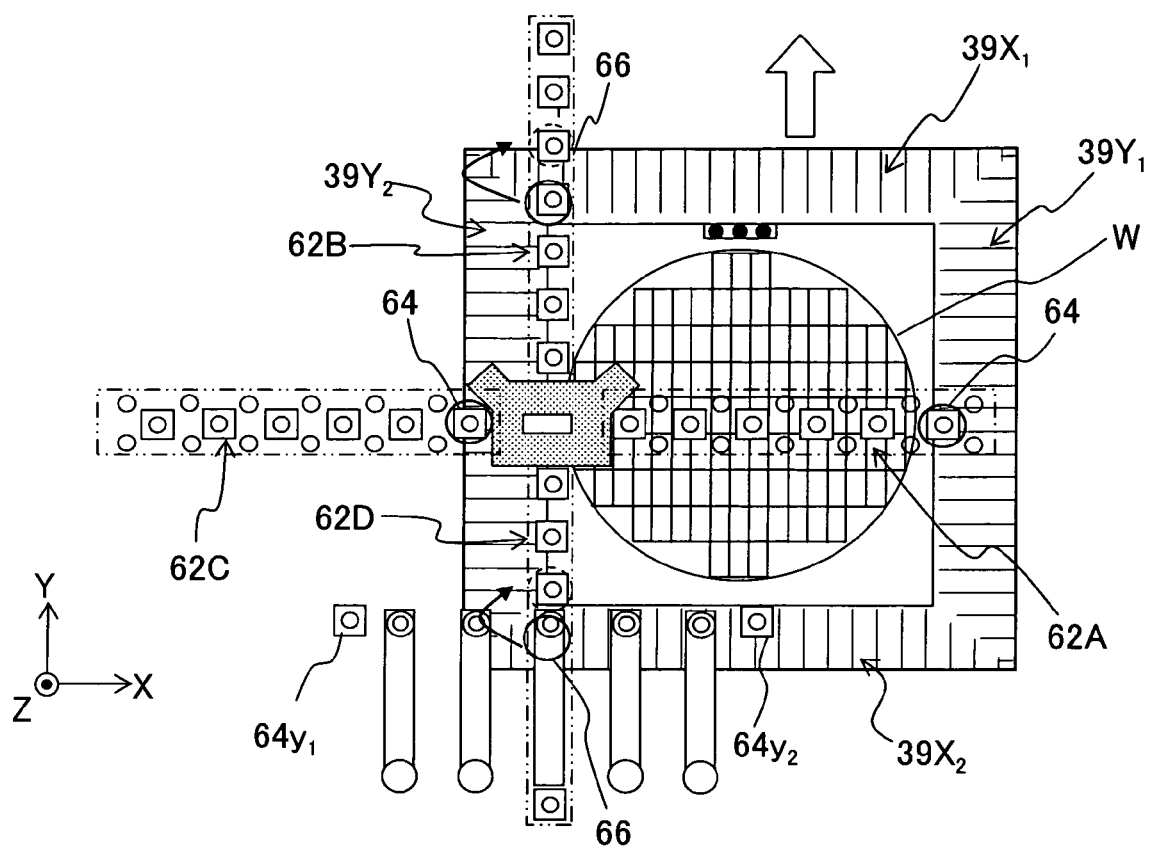

EXPOSURE METHOD, EXPOSURE APPARATUS, AND METHOD FOR PRODUCING DEVICE

This non-provisional application claims the benefit of Provisional Application No. 60/924,710 filed May 29, 2007, the disclosure of which is hereby incorporated herein by reference in its entirety.

BACKGROUND OF THE INVENTION

1. Field of the Invention

The present invention relates to an exposure technique for exposing a substrate such as a wafer, and a device-producing technique for producing, for example, an electronic device such as a semiconductor device or element and a liquid crystal display device or element by using the exposure technique.

2. Description of the Related Art

An exposure apparatus, which includes, for example, a projection exposure apparatus based on the step-and-repeat system (so-called "stepper") and a projection exposure apparatus based on the step-and-scan system (so-called "scanning stepper" (referred to as "scanner" as well)), has been hitherto used in the lithography step for producing an electronic device (microdevice) such as a semiconductor device or element (for example, the integrated circuit) and a liquid crystal display device or element.

In the lithography step for producing the semiconductor element or the like, patterns of multilayered circuits or the like are overlaid and formed on a wafer. If the pattern overlay accuracy (hereinafter simply referred to as "overlay accuracy") is unsatisfactory between the respective layers, then the semiconductor element or the like cannot exhibit a predetermined circuit characteristic, and the yield is lowered. Therefore, in ordinary cases, marks (alignment marks) are previously affixed to a plurality of shot areas on the wafer respectively to detect the positions of the marks (coordinate values) on a stage coordinate system of the exposure apparatus. After that, the wafer alignment is performed, based on mark position information and known position information of a pattern (for example, a reticle pattern) to be newly formed, such that one shot area on the wafer is subjected to the alignment with respect to the pattern.

In consideration of the balance of the throughput, the global alignment has been principally used as the system for the wafer alignment wherein the alignment marks are detected for only some shot areas on the wafer (referred to as "sample shots" or "alignment shots" as well) to determine the regularity of the arrangement of the shot areas, thereby subjecting the respective shot areas to the alignment. In particular, the enhanced global alignment (EGA) is dominantly used among the global alignment, wherein the arrangement of shot areas on the wafer is precisely calculated by means of a statistical technique, as disclosed, for example, in Japanese Patent Application Laid-open No. 61-44429 (U.S. Pat. No. 4,780,617).

In a conventional alignment based on the EGA system, the coordinate values of the marks affixed to a predetermined number of the alignment shots are measured to determine a parameter such as the wafer scaling (linear expansion and contraction) based on the measurement result, and the parameter is used so that the arrangement coordinates of all of the shot areas on the wafer are calculated and the adjustment is made for the projection magnification of the projection optical system, etc.

However, the parameter is gradually changed also during the exposure of the wafer, for example, due to the influence of the thermal energy or the like of an exposure light (exposure light beam) radiated, although the change is slight. Therefore, it is feared that an actual coordinate value of the shot area of the wafer or a size of the circuit pattern in the shot area might be gradually changed with respect to the result of the alignment during the exposure, and thus the overlay accuracy might be lowered or deteriorated. Such change of the parameter during the exposure of the wafer as described above has been hitherto considered to such an extent that the change is negligible. In future, however, a fine and minute structure or arrangement of the integrated circuit will be further advanced. In such a situation, it is necessary to consider the change of the parameter during the exposure of the wafer as well, in order to achieve the required overlay accuracy.

SUMMARY OF THE INVENTION

The present invention has been made taking the foregoing circumstances into consideration, an object of which is to provide an exposure technique and a device-producing technique wherein high overlay accuracy is obtained even when the alignment information including, for example, the linear expansion and contraction of a substrate is gradually changed during the exposure of the substrate such as a wafer.

According to a first aspect of the present invention, there is provided an exposure method for exposing a substrate via a pattern with an exposure light by illuminating the pattern with the exposure light, the exposure method comprising: performing measurement of alignment information of a first substrate before and after exposure of the first substrate; and correcting alignment information of a second substrate before exposure of the second substrate, based on a result of the measurement. According to this invention, the fluctuation or variation of the alignment information during the exposure is determined from the alignment information obtained both before and after the exposure in relation to the first substrate. Therefore, the alignment information of the second substrate is corrected based on the fluctuation, thereby improving the overlay accuracy of the second substrate.

According to a second aspect of the present invention, there is provided an exposure method for exposing a substrate via a pattern with an exposure light by illuminating the pattern with the exposure light, the exposure method comprising: a first step of performing measurement of alignment information of a first substrate before exposure of the first substrate; a second step of exposing the first substrate via the pattern while performing alignment for the first substrate based on a result of the measurement in the first step; a third step of performing measurement of alignment information of the first substrate after the exposure of the first substrate; and a fourth step of determining a fluctuation amount of the alignment information measured in the third step with respect to the alignment information measured in the first step. According to the present invention, the alignment information of a substrate to be exposed next is corrected by using the fluctuation amount of the alignment information determined in the fourth step. Thus, the overlay accuracy of the next substrate is improved.

According to a third aspect of the present invention, there is provided an exposure method for exposing a substrate with an exposure light, the exposure method comprising: performing exposure of a first substrate with the exposure light, and then performing detection of a mark disposed on the first substrate after the exposure; and performing exposure of a second substrate by using a result of the detection of the mark. According to the present invention, for example, the result of the detection of the mark of the second substrate (alignment information) is corrected based on the result of the detection of the mark of the first substrate, thereby improving the overlay accuracy of the second substrate.

According to a fourth aspect of the present invention, there is provided an exposure method for exposing a substrate with an exposure light, the exposure method comprising: performing detection of a mark of a first substrate both before and after exposure of the first substrate with the exposure light; and determining alignment information of a second substrate by using a result of the detection after the exposure. According to the present invention, for example, the result of the detection of the mark of the second substrate is corrected based on the result of the detection of the mark of the first substrate to determine the alignment information of the second substrate, thereby improving the overlay accuracy of the second substrate.

According to a fifth aspect of the present invention, there is provided an exposure apparatus which exposes a substrate via a pattern with an exposure light by illuminating the pattern with the exposure light, the exposure apparatus comprising: a measuring device which measures alignment information of the substrate; a controller which controls exposure of the substrate while performing alignment for the substrate based on a result of the measurement performed by the measuring device; and a calculating device which determines a fluctuation amount of an alignment information measured after the exposure of a predetermined substrate by the measuring device with respect to alignment information measured before the exposure of the predetermined substrate by the measuring device. With this exposure apparatus, it is possible to carry out the exposure methods according to the first and second aspects.

According to a sixth aspect of the present invention, there is provided an exposure apparatus which exposes a substrate with an exposure light, the exposure apparatus comprising: a mark-detecting system which performs detection of a mark of the substrate; and a controller which controls exposure of another substrate, that is to be exposed next to the substrate, by using a result of the detection of the mark of the substrate obtained by the mark-detecting system after exposure of the substrate. With this exposure apparatus, it is possible to carry out the exposure method according to the third aspect of the present invention.

According to a seventh aspect of the present invention, there is provided an exposure apparatus which exposes a substrate with an exposure light, the exposure apparatus comprising: a mark-detecting system which performs detection of a mark of the substrate; and a controller which determines alignment information of another substrate, that is to be exposed next to the substrate, by using result of the detection of the mark of the substrate obtained each before and after the exposure by the mark-detecting system. With this exposure apparatus, it is possible to carry out the exposure method according to the fourth aspect of the present invention.

Further, a method for producing a device according to the present invention comprises: exposing a substrate by using the exposure method of the present invention; developing the exposed substrate; and processing the developed substrate. Since this method for producing the device uses the exposure method of the present invention, the device can be produced highly accurately.

BRIEF DESCRIPTION OF THE DRAWINGS

FIGS. 8A and 8B illustrate the position measurement in the XY plane of a wafer table as performed by the plurality of encoders including a plurality of heads, arranged in an array form respectively, and the successive transfer of measured values between the heads.

DESCRIPTION OF THE PREFERRED EMBODIMENTS

An exemplary embodiment of the present invention will be explained below with reference to the drawings.

Figure 1:
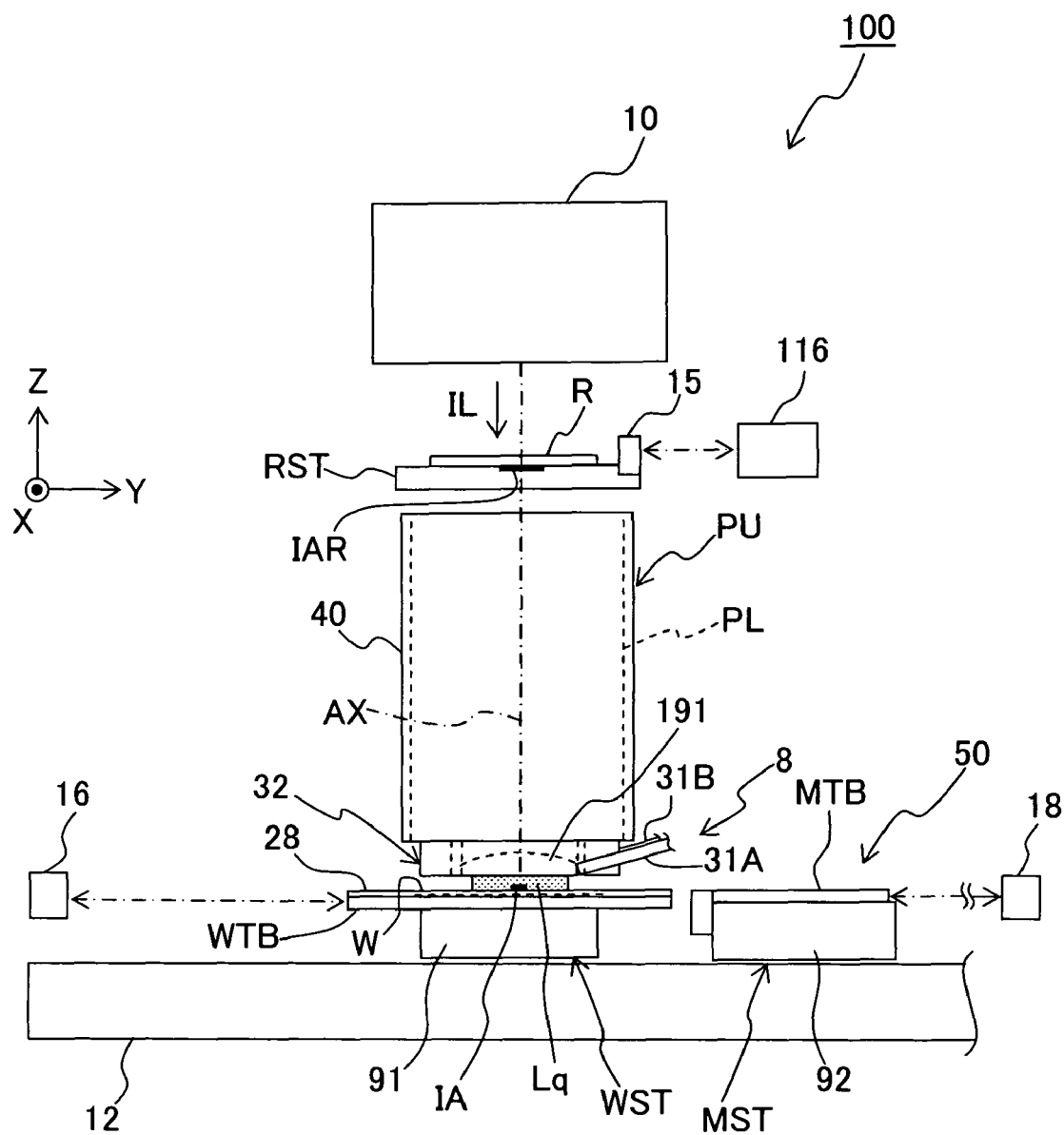
FIG. 1 is a schematic arrangement view of an exposure apparatus according to an exemplary embodiment.

FIG. 1 is a schematic arrangement view of an exposure apparatus 100 according to the embodiment of the present invention. The exposure apparatus 100 is a scanning type exposure apparatus based on the step-and-scan system, i.e., a so-called scanner. As described later on, a projection optical system PL is provided in this embodiment. The following description will be made assuming that an Z axis direction is a direction parallel to the optical axis AX of the projection optical system PL, a Y axis direction is a direction in which a reticle and a wafer are relatively scanned in a plane perpendicular to the optical axis AX, and an X axis direction is a direction which is perpendicular to the Z axis and the Y axis, wherein directions of rotation (inclination) about the X axis, the Y axis, and the Z axis are designated as θx, θy, and θz directions respectively.

The exposure apparatus 100 includes, for example, an illumination system 10; a reticle stage RST which holds a reticle R illuminated with an exposure-illumination light (hereinafter referred to as "illumination light" or "exposure light") IL from the illumination system 10; a projection unit PU including a projection optical system PL which radiates or projects the illumination light IL, outgoing from the reticle R, onto the wafer W; a stage device 50 which has a wafer stage (movable member or movable body) WST and a measuring stage MST; and a control system for these components. The wafer W is placed on the wafer stage WST.

The illumination system 10 includes a light source and an illumination optical system which has a reticle blind, an illuminance-uniformalizing optical system including an optical integrator (for example, a fly's eye lens, a rod integrator (internal reflection type integrator), and/or a diffraction optical element; any one of these components is not shown), etc., as disclosed, for example, in United States Patent Application Publication No. 2003/0025890 (corresponding to Japanese Patent Application Laid-open No. 2001-313250). In the illumination system 10, a slit-shaped illumination area IAR on the reticle R, which is defined by the reticle blind (masking system), is illuminated with the illumination light IL at an approximately uniform illuminance. For example, the ArF excimer laser beam (wavelength: 193 nm) is used as the illumination light IL. Those usable as the illumination light also include the KrF excimer laser beam (wavelength: 247 nm), the $F_2$ laser beam (wavelength: 157 nm), high harmonic wave of the YAG laser, high harmonic wave of the solid laser (semiconductor laser or the like), the emission line (for example, i-ray) of a mercury lamp; and the like. For example, as disclosed in U.S. Pat. No. 7,023,610, it is also allowable to use a high harmonic wave generating device which includes a solid laser light source such as a DFB semiconductor laser or a fiber laser, a light-amplifying section having a fiber amplifier, a wavelength-converting section, etc., and which outputs a pulse light having a wavelength of 193 nm.

Figure 7:
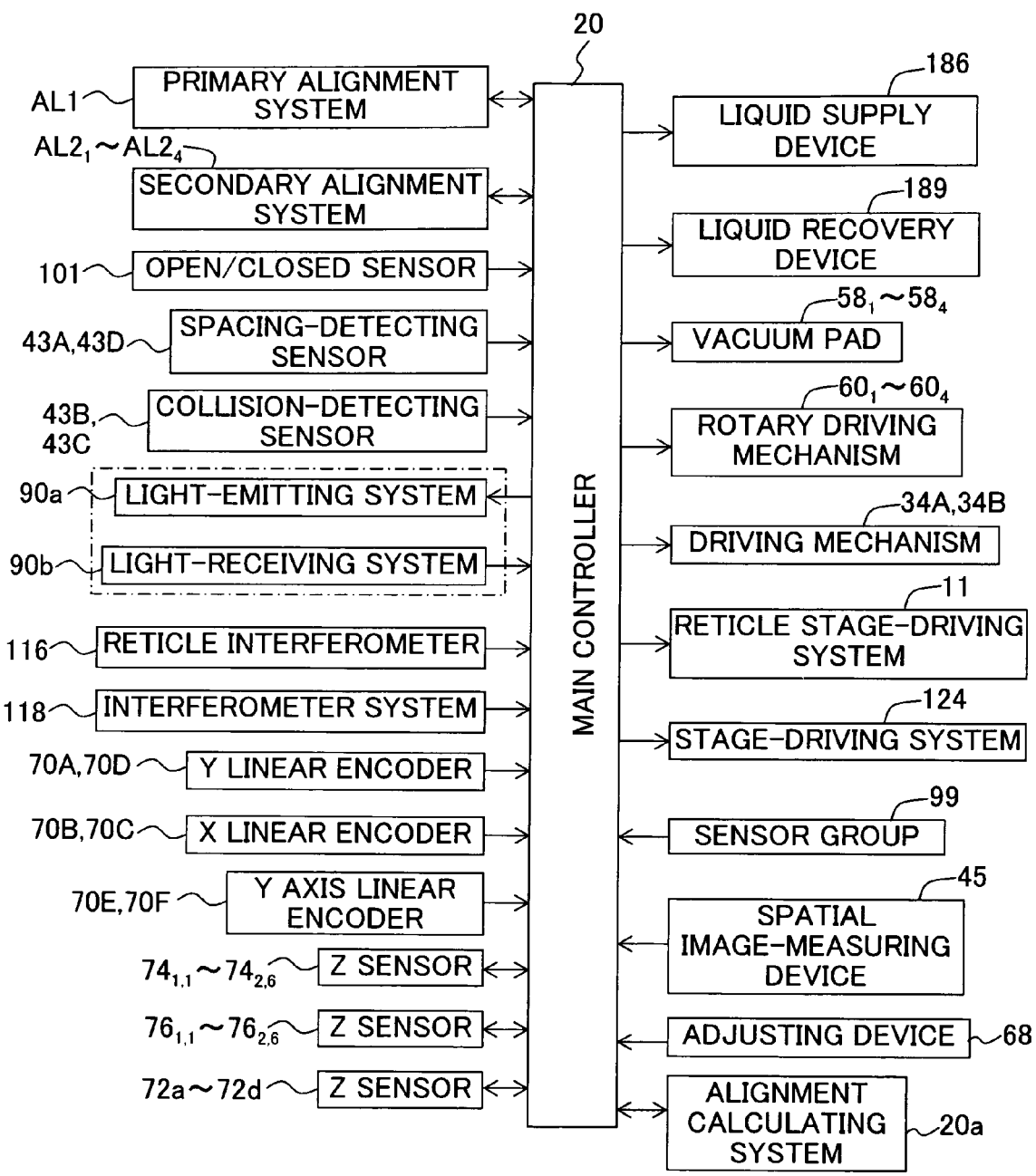
FIG. 7 is a block diagram of main components of a control system of the exposure apparatus according to the exemplary embodiment.

The reticle R, which has a circuit pattern or the like formed on a pattern surface of the reticle R (lower surface in FIG. 1), is fixed (or attached or secured) to the reticle stage RST by the vacuum attraction or the like. The reticle stage RST is finely drivable in the XY plane by a reticle stage-driving system 11 which is shown in FIG. 7 and which includes a linear motor, etc. Further, the reticle stage RST is drivable at a designated scanning velocity in the scanning direction (Y axis direction in FIG. 1).

The position information in a movement plane of the reticle stage RST shown in FIG. 1 (including the information about the rotation in the θz direction) is always detected by a reticle interferometer 116 constructed of a laser interferometer at a resolution of, for example, about 0.5 to 1 nm via a movement mirror 15 (alternatively, an end surface of the stage may be mirror-finished to be used as a reflecting surface). The measured value obtained by the reticle interferometer 116 is fed to a main controller 20 shown in FIG. 7. The main controller 20 calculates positions of the reticle stage RST in the X axis direction, the Y axis direction, and the θz direction based on the measured value of the reticle interferometer 116; and the main controller 20 controls the reticle stage-driving system 11 based on a result of the calculation to thereby control the position (and the velocity) of the reticle stage RST. It is also allowable that the reticle interferometer 116 is also capable of measuring the position information about the reticle stage RST in relation to at least one of the Z axis direction, the θx direction, and the θy direction.

With reference to FIG. 1, the projection unit PU, which is arranged under or below the reticle stage RST, includes a barrel 40, and the projection optical system PL which has a plurality of optical elements retained in the barrel 40 in a predetermined positional relationship. A refraction optical system, which is constructed of, for example, a plurality of lenses (lens elements) arranged along the optical axis AX parallel to the Z axis direction, is used as the projection optical system PL. The projection optical system PL is, for example, a bilateral telecentric system, and has a predetermined projection magnification β (for example, ¼-fold, ⅕-fold, ⅛-fold or the like). Therefore, when the illumination area IAR is illuminated with the illumination light IL from the illumination system 10, a reduction image of the circuit pattern (reduction image of a part of the circuit pattern) of the reticle R in the illumination area IAR is formed, by the illumination light IL passing through the reticle R arranged such that a pattern surface thereof is approximately coincident with a first surface (object plane) of the projection optical system PL (projection unit PU), in an area (hereinafter referred to as "exposure area" as well) IA conjugate with the illumination area IAR on the wafer W having a surface coated with a resist (photosensitive agent) and arranged on the side of a second surface (image plane of) the projection optical system PL, via the projection optical system PL. The projection unit PU may be supported by being hung, for example, by an unillustrated main frame or a mask base on which the reticle stage RST is placed, as disclosed, for example, in International Publication No. 2006/038952.

The projection optical system PL of this embodiment is provided with an image formation characteristic-correcting mechanism which finely adjusts the projection magnification β within a predetermined range, by driving a predetermined lens or predetermined lenses in the direction of the optical axis AX.

The exposure apparatus 100 of this embodiment performs the exposure to which the liquid immersion method is applied. In this case, it is also allowable to use a catadioptric system including a mirror and a lens as the projection optical system PL. Further, it is allowable to form on the wafer W not only the photosensitive layer but also, for example, a protective film (top coat film) for protecting the wafer or the photosensitive layer.

In order to perform the exposure to which the liquid immersion method is applied, the exposure apparatus 100 of this embodiment is provided with a nozzle unit 32 constituting a part of a local liquid immersion device 8 to surround the circumference of the lower end portion of the barrel 40 which holds an end lens 191. The end lens 91 is an optical element constituting the projection optical system PL and disposed closest to the image plane of the projection optical system PL (on the side of the wafer W).

Figure 3:
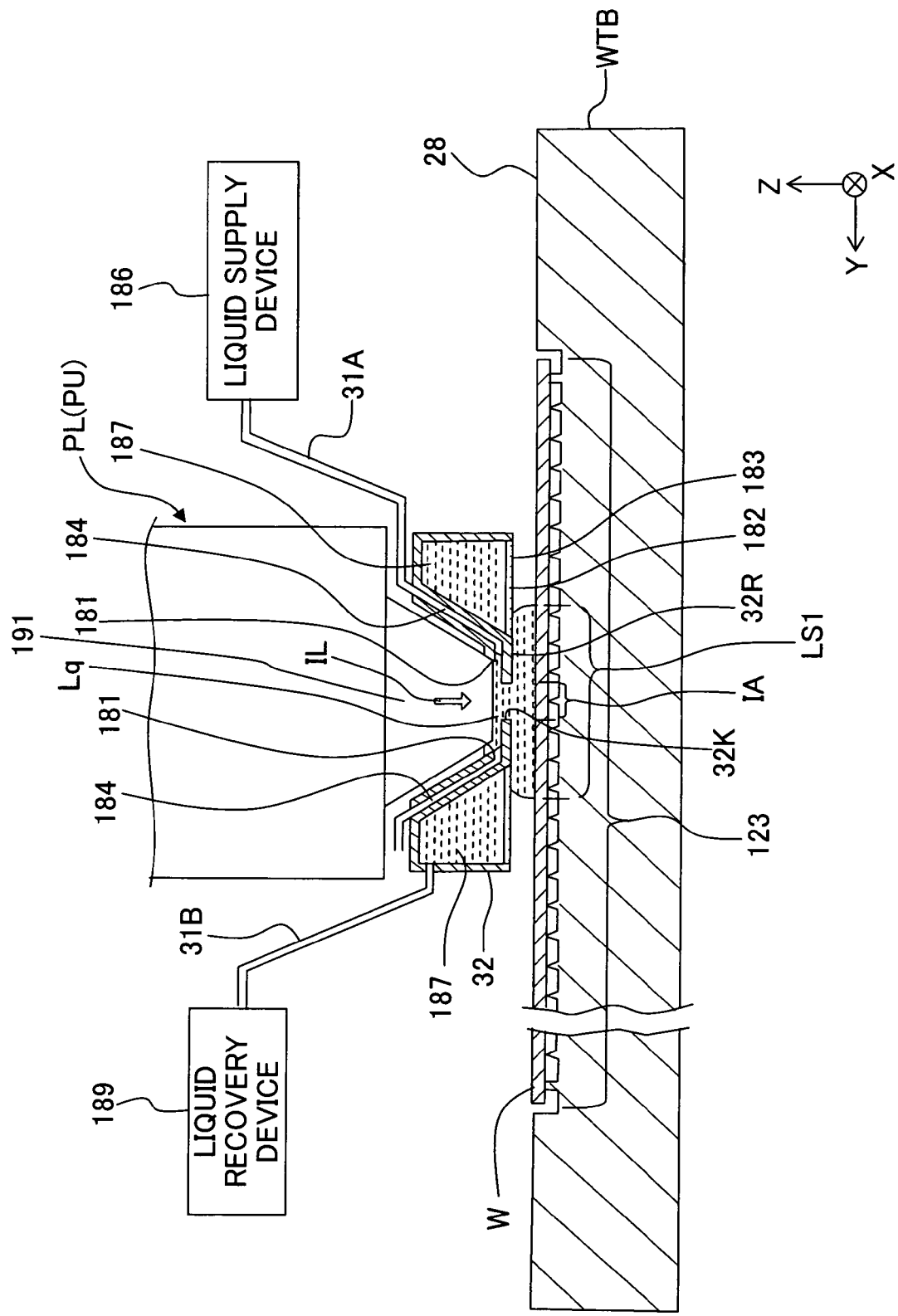
FIG. 3 is a sectional view of a local liquid immersion device shown in FIG. 1.

FIG. 3 shows the structure of the local liquid immersion device including the nozzle unit 32 shown in FIG. 1. For the convenience of the explanation, a plate 28 and a wafer holder 123 are depicted in FIG. 3 as if the plate 28 and the wafer holder 123 are formed integrally with a wafer table WTB; and the shape of the end lens 191 is different from that depicted in FIG. 1. With reference to FIG. 3, the nozzle unit 32 has a supply port 181 capable of supplying an exposure liquid Lq, and a recovery port 182 capable of recovering the exposure liquid Lq. A porous member (mesh) 183 is arranged in the recovery port 182. The lower surface of the nozzle unit 32, which is opposable to the surface of the wafer W, includes both of the lower surface of the porous member 183 and a flat surface 32R which is arranged to surround an aperture 32K provided to allow the illumination light IL to pass therethrough.

The supply port 181 is connected to a liquid supply device 186 which is capable of feeding out the exposure liquid Lq, via a supply tube 31A and a supply flow passage 184 formed in the nozzle unit 32. The recovery port 182 is connected to a liquid recovery device 189 which is capable of recovering at least the exposure liquid Lq, via a supply tube 31B and a recovery flow passage 187 formed in the nozzle unit 32.

The liquid supply device 186 includes a tank for the liquid, a pressurizing pump, a temperature adjusting device, a flow rate control valve for controlling the supply and the stop of the supply of the liquid with respect to the supply tube 31A, and the like. The liquid supply device 186 is capable of feeding out the exposure liquid Lq which is clean and temperature-adjusted. The liquid recovery device 189 includes a tank for the liquid, a suction pump, a flow rate control valve for controlling the recovery and the stop of the recovery of the liquid via the recovery tube 31B, and the like. The liquid recovery device 189 is capable of recovering the exposure liquid Lq. It is not necessarily indispensable that the exposure apparatus 100 is provided with all of the liquid tank, the pressurizing (suction) pump, the temperature regulation unit, the control valve, and the like. At least a part or parts of these component can be also substituted or replaced with the equipment of a factory or the like in which the exposure apparatus 100 is installed.

The operations of the liquid supply device 186 and the liquid recovery device 189 are controlled by the main controller 20 shown in FIG. 7. The exposure liquid Lq, which is fed out from the liquid supply device 186 shown in FIG. 3, flows through the supply tube 31A and the supply flow passage 184 of the nozzle unit 32, and then the exposure liquid Lq is supplied from the supply port 181 to an optical path space for the illumination light IL. The exposure liquid Lq, which is recovered from the recovery port 182 by driving of the liquid recovery device 189, is flows through the recovery flow passage 187 of the nozzle unit 32, and then the exposure liquid Lq is recovered by the liquid recovery device 189 via the recovery tube 31B. The main controller 20 shown in FIG. 7 concurrently performs the liquid supply operation via the supply port 181 and the liquid recovery operation via the recovery port 182, thereby forming a liquid immersion space LS1 of the exposure liquid Lq so that the optical path space for the illumination light IL, between the end lens 191 and the wafer W, is filled with the exposure liquid Lq.

In this embodiment, pure or purified water (water), through which the ArF excimer laser beam (light beam having a wavelength of 193 nm) is transmissive, is used as the exposure liquid Lq. Pure water is advantageous in that pure water is easily available in a large amount in a semiconductor production factor or the like, and pure water exerts no harmful influence on the photoresist on the wafer, the optical lens and the like. The refractive index n of water with respect to the ArF excimer laser beam is approximately 1.44. In water, the wavelength of the illumination light IL is shortened to a wavelength of 193 nm×1/n=about 134 nm. Therefore, the resolution is improved.

As clarified by the foregoing explanation, the apparatus of this embodiment includes, for example, the nozzle unit 32, the liquid supply device 186, the liquid recovery device 189, the liquid supply tube 31A, and the recovery tube 31B, wherein the local liquid immersion device 8 is constructed. A part of the local liquid immersion device 8, for example, at least the nozzle unit 32 may be supported by being hung by the main frame (including the barrel surface plate as described above) for holding the projection unit PU. Alternatively, a part of the local liquid immersion device 8, for example, at least the nozzle unit 32 may be provided on any other frame member which is distinct from the main frame. In this embodiment, the nozzle unit 32 is provided on a measuring frame which is supported in a hanging manner independently from the projection unit PU. In this case, it is also allowable that the projection unit PU is not supported in a hanging manner.

In a case that the measuring stage MST is positioned under or below the projection unit PU shown in FIG. 1, the space between the end lens 191 and the measuring table (which will be described later on) can be also filled with water in the same manner as described above. The foregoing explanation has been made assuming that one piece of the liquid supply tube (nozzle) and one piece of the liquid recovery tube (nozzle) are provided by way of example. However, the numbers of the liquid supply and recovery tubes is not limited to the above example. When the relationship with respect to the surrounding members permits, it is also allowable to adopt a structure or arrangement in which a large number of nozzles are provided, as disclosed in International Publication No. 99/49504. In principle, any structure or any arrangement is allowable provided that the liquid can be supplied to the space between the wafer W and the optical member (end lens) 191 disposed at the lowest end constructing the projection optical system PL. For example, a liquid immersion mechanism disclosed in International Publication No. 2004/053955 or a liquid immersion mechanism disclosed in the specification of European Patent Application Publication No. 1420298 can be also applied to the exposure apparatus of the embodiment of the present invention. As for the nozzle unit, it is also possible to adopt the structure as disclosed, for example, in United States Patent Application Publication No. 2005/0280791, International Publication Nos. 2005/024517, 2004/055803, 2004/057589 and 2004/057590, United States Patent Application Publication No. 2006/0231206, and U.S. Pat. Nos. 6,952,253 and 7,268,845.

With reference to FIG. 1 again, the stage device 50 includes the wafer stage WST and the measuring stage MST which are arranged over or above the base plate 12; an interferometer system 118 (see FIG. 7) including Y axis interferometers 16, 18 which measure the position information of the stages WST, MST; an encoder system used for measuring the position information of the wafer stage WST, for example, when the exposure is performed as described later on; a stage-driving system 124 (see FIG. 7) which drives the stages WST, MST; and the like.

At a plurality of positions on the bottom surface of each of the wafer stage WST and the measuring stage MST, unillustrated non-contact bearings, for example, vacuum pre-loadable pneumatic static pressure bearings (hereinafter referred to as "air pads") are provided. The wafer stage WST and the measuring stage MST are supported in a non-contact manner with a clearance of about several µm over or above the base plate 12 by the static pressure of the pressurized air jetted from the air pads toward the upper surface of the base plate 12. The stages WST, MST can be driven in the two-dimensional directions independently in the Y axis direction and the X axis direction by the stage-driving system 124 shown in FIG. 7.

This feature will be described in further detail below. As shown in a plan view of FIG. 2, a pair of Y axis stators 86, 87, which extend in the Y axis direction, are arranged on the floor surface such that the Y axis stators 86 and 87 are arranged on one side and the other side in the X axis direction respectively, with the base plate 12 intervening therebetween. Each of the Y axis stators 86, 87 is constructed of, for example, a magnetic pole unit which has a permanent magnet group including a plurality of sets of N pole magnets and S pole magnets arranged alternately at predetermined intervals in the Y axis direction. The Y axis stator 86 is provided with two Y axis movers 82, 84 and the Y axis stator 87 is provided with two Y axis movers 83, 85 in a state of being engaged in a non-contact manner. That is, the four Y axis movers 82, 84, 83, 85 in total are in a state of being inserted into internal spaces of the Y axis stators 86, 87 each having a U-shaped XZ cross section. The Y axis movers 82, 84, 83, 85 are supported, with respect to the corresponding Y axis stators 86, 87 respectively, in a non-contact manner with a clearance of, for example, several µm via the unillustrated air pads. Each of the Y axis movers 82, 84, 83, 85 is constructed of, for example, an armature unit which includes armature coils arranged at predetermined intervals in the Y axis direction. That is, in this embodiment, a moving coil type Y axis linear motor is constructed by the Y axis movers 82, 84 each of which is constructed of the armature unit and the Y axis stator 86 which is constructed of the magnetic pole unit. Similarly, a moving coil type Y axis linear motor is constructed by the Y axis movers 83, 85 and the Y axis stator 87. In the following description, the four Y axis linear motors are appropriately referred to as "Y axis linear motors 82, 84, 83, 85" by using the same reference numerals as those of the respective movers 82, 84, 83, 85.

The movers 82, 83 of the two Y axis linear motors 82, 83 among the four Y axis linear motors are fixed or secured to one end and the other end, respectively, in the longitudinal direction of an X axis stator 80 which extends in the X axis direction. Further, the movers 84, 85 of the remaining two Y axis linear motors 84, 85 are fixed or secured to one end and the other end, respectively, of an X axis stator 81 which extends in the X axis direction. Therefore, the X axis stators 80, 81 are driven along the Y axis by the pairs of Y axis linear motors 82 and 83, 84 and 85, respectively.

Each of the X axis stators 80, 81 is constructed of, for example, an armature unit which includes armature coils arranged at predetermined intervals in the X axis direction.

The X axis stator 81 as one of the X-axis stators is provided in a state of being inserted into an unillustrated opening formed for a stage body 91 (see FIG. 1) which constitutes a part of the wafer stage WST. A magnetic pole unit, which includes, for example, a permanent magnet group constructed of a plurality of sets of N pole magnets and S pole magnets arranged alternately at predetermined intervals in the X axis direction, is provided in the opening of the stage body 91. A moving magnet type X axis linear motor, which drives the stage body 91 in the X axis direction, is constructed by the magnetic pole unit and the X axis stator 81. Similarly, the X axis stator 80 as the other of the X axis stators is provided in a state of being inserted into an opening formed for a stage body 92 which constitutes the measuring stage MST. A magnetic pole unit, which is equivalent to that provided on the side of the wafer stage WST (on the side of the stage body 91), is provided in the opening of the stage body 92. A moving magnet type X axis linear motor, which drives the measuring stage MST in the X axis direction, is constructed by the magnetic pole unit and the X axis stator 80.

In this embodiment, the respective linear motors, which constitute the stage-driving system 124, are controlled by the main controller 20 shown in FIG. 7. The respective linear motors are not limited to any one of those of the moving magnet type and the moving coil type, and may be appropriately selected as necessary. By making the thrust forces, generated by the pair of Y axis linear motors 84, 85 (or 82, 83) respectively, to be slightly different, it is possible to control the yawing (rotation in the θz direction) of the wafer stage WST (or the measuring stage MST).

The wafer stage WST includes the stage body 91 described above, and a wafer table WTB provided on the stage body 91 via an unillustrated Z-leveling mechanism (for example, a voice coil motor) and finely driven in the Z axis direction, the θx direction, and the θy direction relative to the stage body 91. FIG. 7 shows the stage-driving system 124 as including the Z-leveling mechanism and the respective linear motors described above.

Figure 5A:
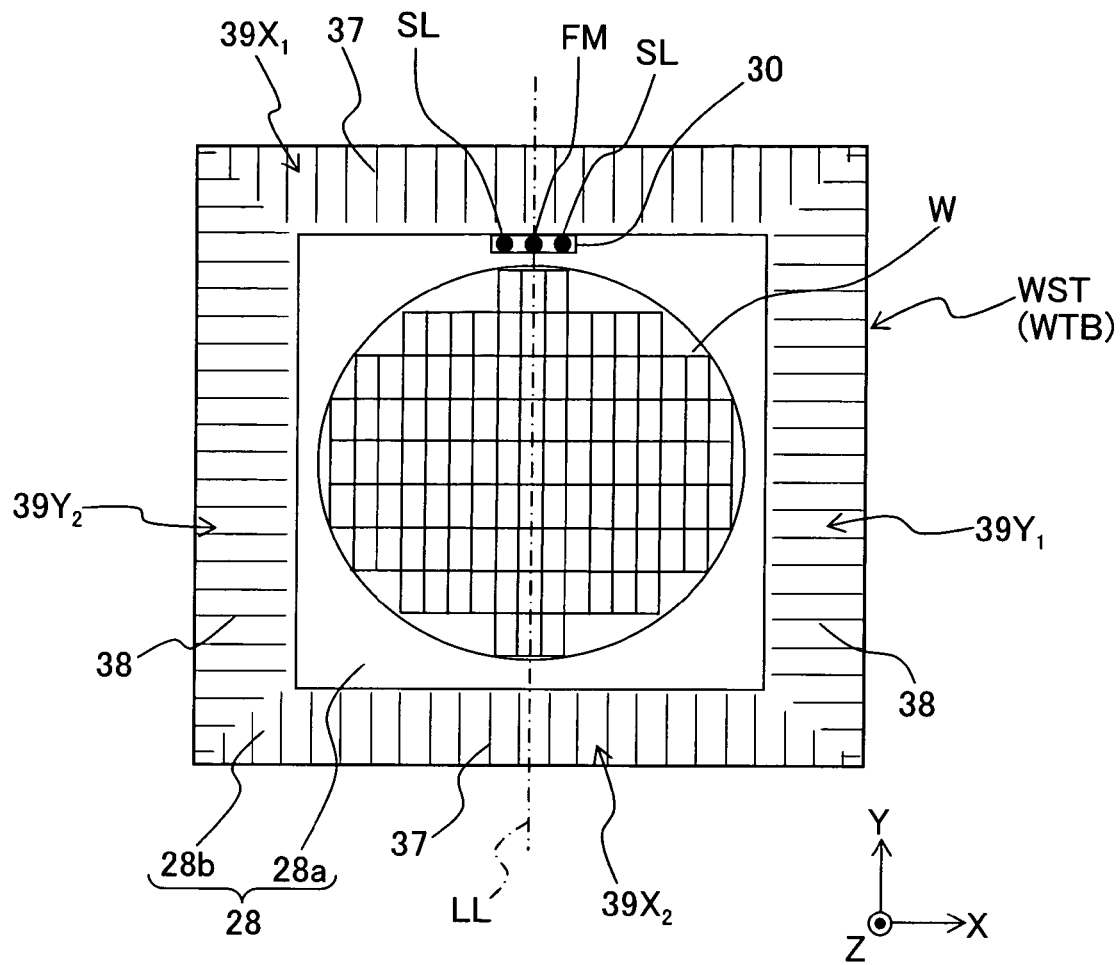
FIG. 5A is a plan view of a wafer stage.

A wafer holder (not shown), which holds the wafer W by the vacuum attraction or the like, is provided on the wafer table WTB. The wafer holder may be formed integrally with (as an integrated body with) the wafer table WTB. However, in this embodiment, the wafer holder and the wafer table WTB are constructed separately, and the wafer holder is fixed into the recess of the wafer table WTB, for example, by the vacuum attraction. A plate (liquid-repellent plate) 28 is provided on the upper surface of the wafer table WTB. The plate 28 has a surface (liquid-repellent surface) subjected to the liquid-repelling treatment with respect to the liquid Lq and is substantially flush with a surface of the wafer placed on the wafer holder. Further, the plate 28 has a rectangular outer shape (contour), and a circular opening, which is one size larger than the wafer holder (area for placing the wafer therein), is formed at a central portion of the plate 28. The plate 28 is formed of a material having a low coefficient of thermal expansion, for example, glass or ceramics (Zerodur (trade name) produced by Schott, $Al_2O_3$, TiC, etc.). On the surface of the plate 28, a liquid-repellent film is formed, for example, with a fluorine-based resin material such as a fluororesin material and polytetrafluoroethylene (Teflon (trade name)), an acrylic resin material, or a silicon-based resin material. As shown in a plan view of FIG. 5A illustrating the wafer table WTB (wafer stage WST), the plate 28 has a first liquid-repellent area 28a which surrounds the circular opening and which has a rectangular outer shape (contour), and a second liquid-repellent area 28b which is arranged around the first liquid-repellent area 28a and which is rectangular frame-shaped (surrounding annular contour). At least a part of a liquid immersion area 14, which protrudes from or spreads beyond the surface of the wafer, for example, during the exposure operation, is formed or located in the first liquid-repellent area 28a. A scale for the encoder system as described later on is formed or located in the second liquid-repellent area 28b. It is also allowable that at least a part of the surface of the plate 28 is not flush with the surface of the wafer. That is, it is also allowable that at least a part of the surface of the plate 28 has a different height from the surface of the wafer. Although the plate 28 may be a single plate, in this embodiment, the plate 28 is constructed by combining a plurality of plates, for example, first and second liquid-repellent plates corresponding to the first and second liquid-repellent areas 28a, 28b respectively. In this embodiment, pure water is used as the liquid Lq as described above. Therefore, in the following description, the first and second liquid-repellent areas 28a, 28b are referred to also as "first and second water-repellent plates 28a, 28b", respectively.

In this case, the first water-repellent plate 28a disposed on the inner side is irradiated with the illumination light IL, while the second water-repellent plate 28b disposed on the outer side is scarcely irradiated with the illumination light IL. In consideration of this, in this embodiment, a first water-repellent area, which is coated with a water-repellent coat having sufficient durability against the illumination light IL (light in the vacuum ultraviolet region in this case), is formed on the surface of the first water-repellent plate 28a, and a second water-repellent area, which is applied with a water-repellent coat inferior in durability against the illumination light IL than the first water-repellent area, is formed on the surface of the second water-repellent plate 28b.

As clarified from FIG. 5A, a rectangular or oblong cutout, which has the longitudinal direction in the X axis direction, is formed at a central portion in the X axis direction at the end of the first water-repellent plate 28a in the +Y direction. A measuring plate 30 is embedded in a rectangular space (in the cutout) surrounded by the cutout and the second water-repellent plate 28b. A reference mark FM is formed at the center in the longitudinal direction of the measuring plate 30 (on a center line LL of the wafer table WTB). Further, a pair of spatial image-measuring slit patterns (slit-shaped measuring patterns) SL are formed while being arranged symmetrically in relation to the center of the reference mark, on one side and the other side in the X axis direction of the reference mark, respectively. Those usable as each of the spatial image-measuring slit patterns SL include, for example, an L-shaped slit pattern having sides in the Y axis direction and the X axis direction, and a slit pattern including two linear patterns extending in the X axis direction and the Y axis direction respectively.

Figure 5B:
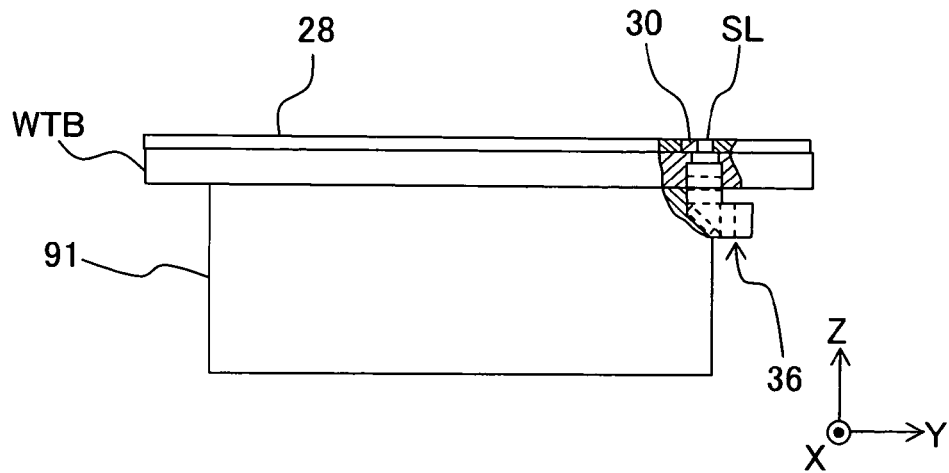
FIG. 5B is a side view, with a partial cross section, of the wafer stage WST.

As shown in FIG. 5B, in the wafer stage WST disposed under or below each of the spatial image-measuring slit patterns SL, an L-shaped casing 36, in which an optical system including an objective lens, a mirror, a relay lens and the like is accommodated, is attached in a state that the L-shaped casing 36 is partially embedded while penetrating from the wafer table WTB through a part of the interior of the stage body 91. Although not shown, the L-shaped casing 36 is provided as a pair of casings 36 corresponding to the pair of spatial image-measuring slit patterns SL, respectively.

The optical system included in the casing 36 guides, along the L-shaped path, the illumination light IL transmitted through the spatial image-measuring slit pattern SL so that the illumination light IL outgoes or exits in the −Y direction. In the following description, for the purpose of convenience, the optical system included in the casing 36 is referred to as "light-feeding system 36" by using the same reference numeral as that of the casing 36.

On the upper surface of the second water-repellent plate 28b, a large number of grating lines are directly formed at predetermined pitches along the four sides of the upper surface of the plate 28. This feature will be described in further detail below. Y scales $39Y_1$, $39Y_2$ are formed in areas on one side and the other side respectively in the X axis direction of the second water-repellent plate 28b (on both of the left and right sides as viewed in FIG. 5A). Each of the Y scales $39Y_1$, $39Y_2$ is constructed of, for example, a reflecting type grating (for example, a diffraction grating) periodically arranged in the Y axis direction, wherein grating lines 38, which extend in the X axis direction, are formed in a direction parallel to the Y axis (Y axis direction) at predetermined pitches.

Similarly, X scales $39X_1$, $39X_2$ are formed in areas on one side and the other side respectively in the Y axis direction of the second water-repellent plate 28b (on both of the upper and lower sides as viewed in FIG. 5A). Each of the X scales $39X_1$, $39X_2$ is constructed of, for example, a reflecting type grating (for example, a diffraction grating) periodically arranged in the X axis direction, wherein grating lines 37, which extend in the Y axis direction, are formed in a direction parallel to the X axis (X axis direction) at predetermined pitches. A member or material, in which the reflecting type diffraction grating is prepared by the hologram, etc. on the surface of the second water-repellent plate 28b, is used as each of the scales. In this case, the gratings, which are constructed of narrow slits, grooves or the like, are engraved at predetermined intervals (pitches) as the scaling on each of the scales. The type of the diffraction grating to be used for each of the scales is not limited. Those usable include not only those in which the grooves or the like are mechanically formed but also, for example, those in which interference fringes are thermally formed and prepared on a photosensitive resin. However, each of the scales is prepared, for example, such that the scalings of the diffraction grating are engraved on a thin plate-shaped glass material, for example, at a pitch between 138 nm to 4 μm, for example, at a pitch of 1 μm. The scales are covered with the liquid-repellent film (water-repellent film) as described above. In FIG. 5A, for the purpose of convenience of the illustration, the pitch of the grating is depicted extremely widely than the actual pitch. The same or equivalent illustration is made in the other drawings as well.

As described above, in this embodiment, the second liquid-repellent plate 28b itself constitutes the scale. Therefore, a glass plate, which is thermally expandable to a lower extent, is used as the second water-repellent plate 28b. However, the second water-repellent plate 28b is not limited to this. A scale member, which is constructed of a glass plate or the like that is thermally expandable to a low extent, may be fixed to the upper surface of the wafer table WTB, for example, by a plate spring (or vacuum attraction) so that any local expansion and contraction does not occur. In this case, a water-repellent plate, in which the same water-repellent coat is applied to the entire surface, may be used instead of the plate 28.

Figure 2:
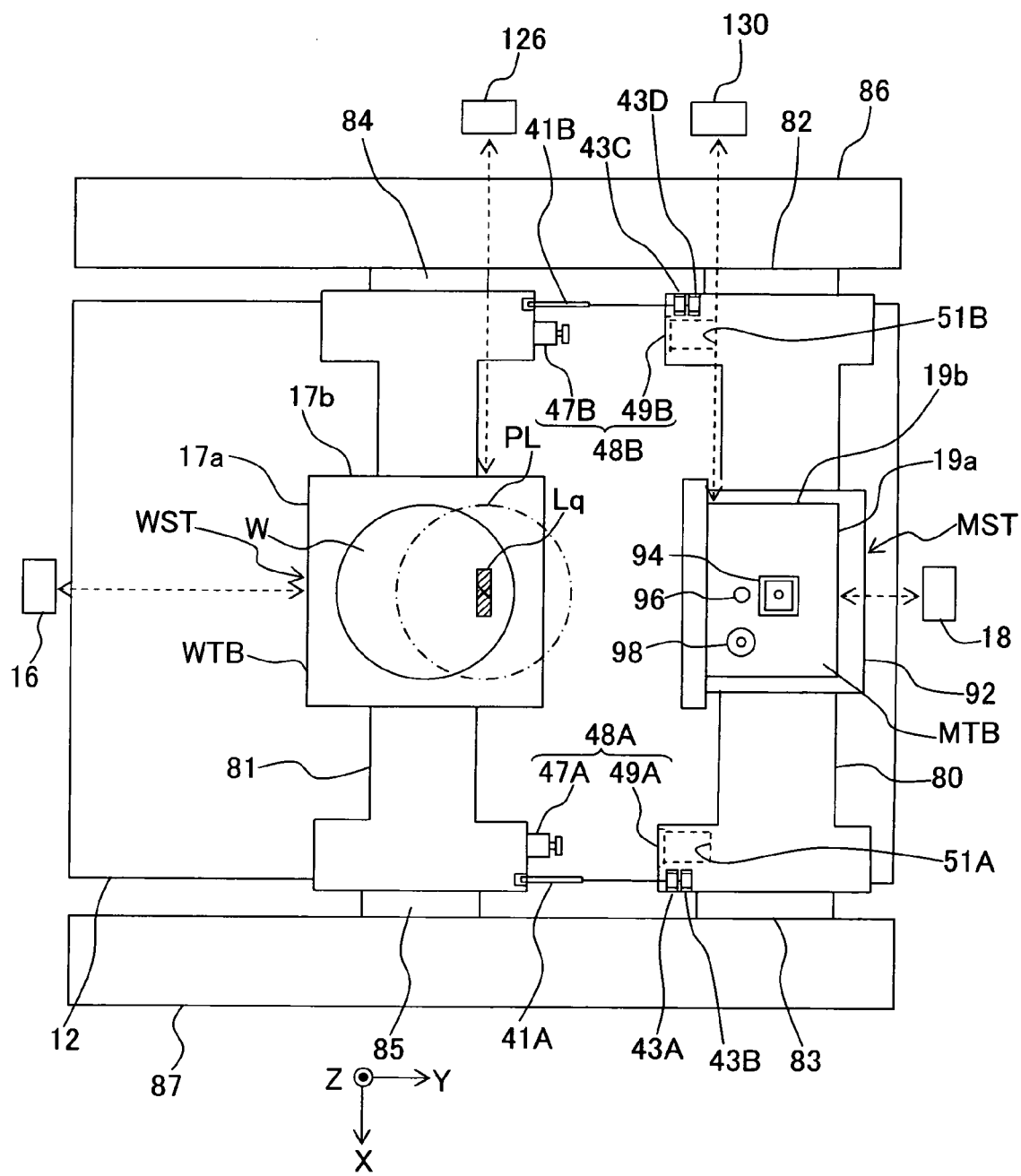
FIG. 2 is a plan view of a stage device shown in FIG. 1.

The −Y end surface and the −X end surface of the wafer table WTB are mirror-finished, and a reflecting surface 17a and a reflecting surface 17b shown in FIG. 2 are formed on the −Y end surface and the −X end surface respectively. A Y axis interferometer 16 and an X axis interferometer 126 (see FIG. 2) of the interferometer system 118 (see FIG. 7) radiate interferometer beams (length-measuring beams) onto the reflecting surfaces 17a, 17b respectively, and the reflected light (reflected light beams) thereof are received to thereby measure the displacement from a reference position of each of the reflecting surfaces (in general, a fixed mirror is arranged on a side surface of the projection unit PU, and this position is regarded as the reference surface or plane), i.e., the position information in the XY plane of the wafer stage WST. Obtained measured values are supplied to the main controller 20. In this embodiment, a multi-axis interferometer, which has a plurality of optical axes, is used for both of the Y axis interferometer 16 and the X axis interferometer 126. The main controller 20 is also capable of measuring information about the rotation in the θx direction (i.e., pitching), information about the rotation in the θy direction (i.e., rolling), and information about the rotation in the θz direction (i.e., yawing) in addition to the X, Y position of the wafer table WTB, based on the measured values of the Y axis interferometer 16 and the X axis interferometer 126. However, in this embodiment, the position information in the XY plane of the wafer stage WST (wafer table WTB) (including the information about the rotation in the θz direction) is mainly measured by an encoder system described later on including the above-described Y scale and X scale, etc. The measured values of the interferometers 16, 126 are used in an auxiliary manner, for example, upon correcting (calibrating) the long-term fluctuation of the measured value of the encoder system (as caused, for example, due to the time-dependent change of the scale). The Y axis interferometer 16 is used to measure, for example, the Y position of the wafer table WTB in the vicinity of the unloading position and the loading position as will be described later on, in order to exchange the wafer. The measured information of the interferometer system 118, i.e., at least one of the position informations in the directions of five degrees of freedom (X axis, Y axis, θx, θy, and θz directions) is also used, for example, for the movement of the wafer stage WST between loading and alignment operations and/or between exposure and unloading operations. At least a part (for example, the optical system) of the interferometer system 118 may be provided on the main frame for holding the projection unit PU, or may be provided integrally with the projection unit PU supported in the hanging manner as described above. However, in this embodiment, the interferometer system 118 is provided on the measuring frame described above.

In this embodiment, the wafer stage WST includes the stage body 91 which is freely movable in the XY plane, and the wafer table WTB which is provided on the stage body 91 and which is finely drivable relative to the stage body 91 in the Z axis direction, the θx direction, and the θy direction. However, there is no limitation to this. It is of course allowable to adopt a single stage which is movable in the six degrees of freedom as the wafer stage WST. A movement mirror, which is constructed of a plane mirror, may be provided for the wafer table WTB instead of the reflecting surface 17a, 17b. Further, the position information of the wafer stage WST is measured by using the reference surface of the reflecting surface of the fixed mirror provided for the projection unit PU. However, the position, at which the reference surface is arranged, is not limited to a position on the projection unit PU. It is not necessarily indispensable that the position information of the wafer stage WST is measured by using the fixed mirror.

In this embodiment, the position information of the wafer stage WST, which is measured by the interferometer system 118, is not used for the alignment operation and the exposure operation as described later on, and is mainly used for the calibration operation of the encoder system (i.e., the calibration of the measured value), etc. However, the measured information of the interferometer system 118 (i.e., at least one of the pieces of the position information in the directions of five degrees of freedom) may be used, for example, in the exposure operation and/or the alignment operation. In this embodiment, the encoder system measures the position information of the wafer stage WST in the directions of three degrees of freedom, i.e., in the X axis, Y axis, and θz directions. Accordingly, for example, in the exposure operation, it is also allowable to use, among the measured information of the interferometer system 118, only the position information in relation to the direction or directions different from the directions of measurement (X axis, Y axis and θz directions) of the position information of the wafer stage WST by the encoder system, for example, only information(s) in relation to the θx direction and/or the θy direction; and it is also allowable to use position information in relation to a direction same as the measuring direction of the encoder system (i.e., at least one of the X axis, Y axis, and θz directions) in addition to the position information in the different direction or directions. Further, it is also allowable that the interferometer system 118 is capable of measuring the position information in the Z axis direction of the wafer stage WST. In this case, the position information in the Z axis direction may be used, for example, in the exposure operation.

Figure 6A:
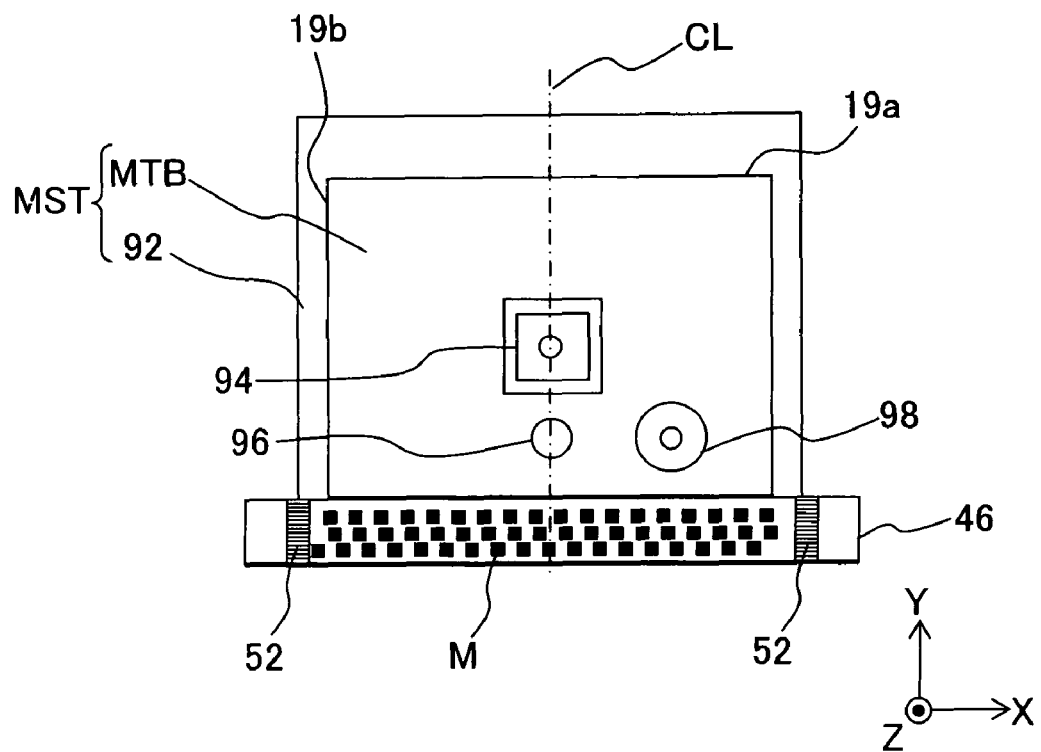
FIG. 6A is a plan view of a measuring stage.

Various measuring members are provided for the measuring table MTB shown in FIG. 2 (and the stage body 92). For example, as shown in FIGS. 2 and 6A, those adopted as the measuring members include, for example, an uneven illuminance sensor 94 which has a pinhole-shaped light-receiving section for receiving the illumination light IL on the image plane of the projection optical system PL; a spatial image measuring device 96 which measures a spatial image (projected image) of the pattern projected by the projection optical system PL; and a wave aberration measuring device 98 of the Shack-Hartman system disclosed, for example, in International Publication No. 03/065428.

In this embodiment, the liquid immersion exposure is performed to expose the wafer W with the illumination light IL via the projection optical system PL and the liquid (water) Lq. Corresponding to this, the illumination light IL is received via the projection optical system PL and water in the uneven illuminance sensor 94 (and an illuminance monitor), the spatial image measuring device 96, and the wave aberration measuring device 98 described above used for the measurement based on the use of the illumination light IL.

Figure 6B:
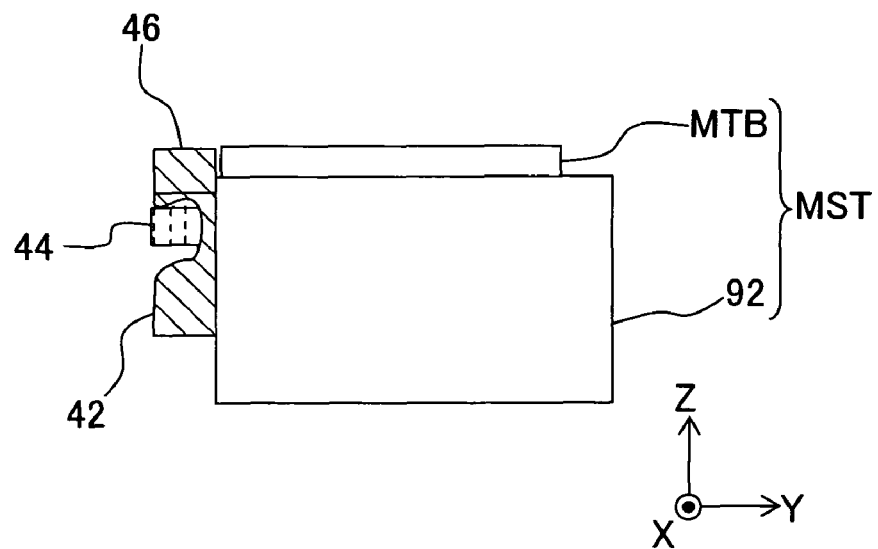
FIG. 6B is a side view, with a partial cross section, of the measuring stage.

As shown in FIG. 6B, a frame-shaped attachment member 42 is fixed to the end surface on the −Y side of the stage body 92 of the measuring stage MST. On the end surface on the −Y side of the stage body 92, a pair of light-receiving systems 44, which are in the arrangement opposable to the pair of light-feeding systems 36 described above, are fixed in the vicinity of the center position in the X axis direction in the opening of the attachment member 42. Each of the light-receiving systems 44 is constructed of an optical system such as a relay lens, a light-receiving element, for example, a photomultiplier tube, and a casing for accommodating these components. As appreciated from FIGS. 5B and 6B as well as from the foregoing explanation, in this embodiment, the illumination light IL, transmitted through each of the spatial image-measuring slit patterns SL of the measuring plate 30, is guided by one of the light-feeding systems 36 described above, and the illumination light IL is received by the light-receiving element of one of the light-receiving systems 44, in a state (including a contact state) that the wafer stage WST is disposed closely to the measuring stage MST within a predetermined distance in relation to the Y axis direction. That is, the measuring plate 30, the light-feeding system 36, and the light-receiving system 44 construct a spatial image-measuring device 45 (see FIG. 7) in the same manner as those disclosed in United States Patent Application Publication No. 2002/0041377 (corresponding to Japanese Patent Application Laid-open No. 2002-14005), U.S. Pat. No. 6,897,963 as described above, etc.

A confidential bar (hereinafter abbreviated as "CD bar") 46, which serves as a reference member or a fiducial member constructed of a rod-shaped member of which cross section is a rectangular, is provided on the attachment member 42 to extend in the X axis direction. The CD bar 46 is supported kinematically on the measuring stage MST by the full kinematic mount structure. The CD bar is also referred to as "fiducial bar" or the like.

The CD bar 46 serves as the standard (measurement reference). Therefore, an optical glass ceramics having a low coefficient of thermal expansion, for example, Zerodur (trade name) produced by Schott, etc. is adopted as the material for the CD bar 46. The upper surface (surface) of the CD bar 46 is set so that the flatness is high equivalently to the so-called reference plane plate. As shown in FIG. 6A, reference gratings (for example, diffraction gratings) 52, each of which has the periodic direction in the Y axis direction, are formed in the vicinity of the ends on one side and the other side respectively in the longitudinal direction of the CD bar 46. The pair of reference gratings 52 are formed in a symmetrical arrangement in relation to the center in the X axis direction of the CD bar 46, i.e., in relation to the center line CL described above, with a predetermined distance (referred to as "L") between the reference gratings 52.

A plurality of reference marks M are formed on the upper surface of the CD bar 46 in an arrangement as shown in FIG. 6A. The plurality of reference marks M are formed in an arrangement of three rows or arrays in relation to the Y axis direction at a same pitch. The plurality of reference marks M are formed while the arrangements of the respective rows are deviated or shifted by predetermined distances in relation to the X axis direction. Two-dimensional marks, which have a dimension detectable by a primary alignment system and a secondary alignment system (mark-detecting system or detector) as described later on, are used as the respective reference marks M. The reference mark M may have a shape (structure) different from the above-described reference mark FM. However, in this embodiment, the reference mark M is constructed in the same manner as the reference mark FM, and is also constructed in the same manner as the alignment mark of the wafer W. In this embodiment, the surface of the CD bar 46 and the surface of the measuring table MTB (the above-described measuring member may be included as well) are also covered with liquid-repellent films (water-repellent films) respectively.

Reflecting surfaces 19a, 19b, which are equivalent to those of the wafer table WTB described above, are also formed on the +Y end surface and the −X end surface of the measuring table MTB (see FIGS. 2 and 6A). A Y axis interferometer 18 and an X axis interferometer 130 (see FIG. 2) of the interferometer system 118 (see FIG. 7) radiate interferometer beams (length-measuring beams) onto the reflecting surfaces 19a, 19b respectively, and receive reflected lights respectively as shown in FIG. 2, thereby measuring the displacement of each of the reflecting surfaces from the reference position, i.e., the position information of the measuring stage MST (including, for example, at least the position information in the X axis direction and the Y axis direction and the information about the rotation in the θz direction). Obtained measured values are supplied to the main controller 20.

As shown in FIG. 2, the X axis stator 81 and the X axis stator 80 are provided with stopper mechanisms 48A, 48B. The stopper mechanism 48A includes a shock absorber 47A as a buffer unit which is provided on the X axis stator 81 and which is constructed of, for example, an oil damper, and a shutter 49A which is provided at a position (end surface of the +X end on the −Y side), of the X axis stator 80, opposed to or facing the shock absorber 47A. An opening 51A is formed in the X axis stator 80 at a position opposed to the shock absorber 47A.

The shutter 49A can allow the opening 51A to be in an open state or in a closed state. The open/closed state of the opening 51A, which is brought about by the shutter 49A, is detected by an open/closed sensor 101 (see FIG. 7) provided in the vicinity of the shutter 49A. An obtained result of the detection is fed to the main controller 20.

The stopper mechanism 48B also includes a shock absorber 47B which is provided in the vicinity of the −X end of the X axis stator 81, and a shutter 49B which is provided on the X axis stator 80 at a position opposed to or facing the shock absorber 47B, in the same manner as the stopper mechanism 48A. An opening 51B is formed in the X axis stator 80 at a portion on the +Y side of the shutter 49B.

An explanation will now be made about the function of the stopper mechanisms 48A, 48B as representatively exemplified by the stopper mechanism 48A.

With reference to FIG. 2, when the shutter 49A is in the state to close the opening 51A, the shock absorber 47A and the shutter 49A makes contact (abutment) with each other, even when the X axis stator 81 and the X axis stator 80 approach closely to each other. Accordingly, the X axis stators 80, 81 cannot make approach closely to each other any more. On the other hand, in a case that the shutter 49A is opened to open the opening 51A, when the X axis stators 81, 80 make approach close to each other, then at least a part of the end portion of the shock absorber 47A can enter the opening 51A, and the X axis stators 81, 80 can make approach closely to each other. As a result, the wafer table WTB and the measuring table MTB (CD bar 46) can make contact with each other (or make close approach closely to each other at a distance of about 300 μm).

With reference to FIG. 2, a spacing-detecting sensor 43A and a collision-detecting sensor 43B are provided at the +X end of the X axis stator 80. A plate-shaped member 41A, which is slender in the Y axis direction, is provided at the +X end of the X axis stator 81 to protrude on the +Y side. As shown in FIG. 2, a spacing-detecting sensor 43C and a collision-detecting sensor 43D are provided at the −X end of the X axis stator 80; and a plate-shaped member 41B, which is slender in the Y axis direction, is provided at the −X end of the X axis stator 81 to protrude on the +Y side.

The spacing-detecting sensor 43A is constructed of, for example, a transmission type photosensor (for example, a sensor constructed of an element such as LED-phototransistor). The X axis stator 80 and the X axis stator 81 make approach closely to each other, to make the plate-shaped member 41A enter a space between the elements of the spacing-detecting sensor 43A, thereby decreasing the amount of received light. Accordingly, it is possible to detect that the spacing distance between the X axis stators 80, 81 is not more than a predetermined distance.

The collision-detecting sensor 43B is a photoelectric sensor equivalent or similar to the spacing-detecting sensor 43A; and the collision-detecting sensor 43B is arranged farther separately from the plate-shaped member 41A than the spacing-detecting sensor 43A. In the collision-detecting sensor 43B, the upper half portion of the plate-shaped member 41A is positioned between the elements of the sensor at a stage at which the X axis stators 81, 80 further make approach closely to each other and the wafer table WTB and the CD bar 46 (measuring table MTB) make contact with each other (or at a stage at which the wafer table WTB and the CD bar 46 (measuring table MTB) make approach closely to each other at a distance of about 300 μm). Therefore, the main controller 20 can detect that the both tables make contact with each other (or make approach closely to each other at a distance of about 300 μm) by detecting that the amount of received light of the sensor is zero.

The spacing-detecting sensor 43C and the collision-detecting sensor 43D, which are provided in the vicinity of the −X end of the X axis stator 80, are also constructed in the same manner as the spacing-detecting sensor 43A and the collision-detecting sensor 43B described above. The plate-shaped member 41B is also constructed in the same manner as the plate-shaped member 41A described above.

Figure 4:
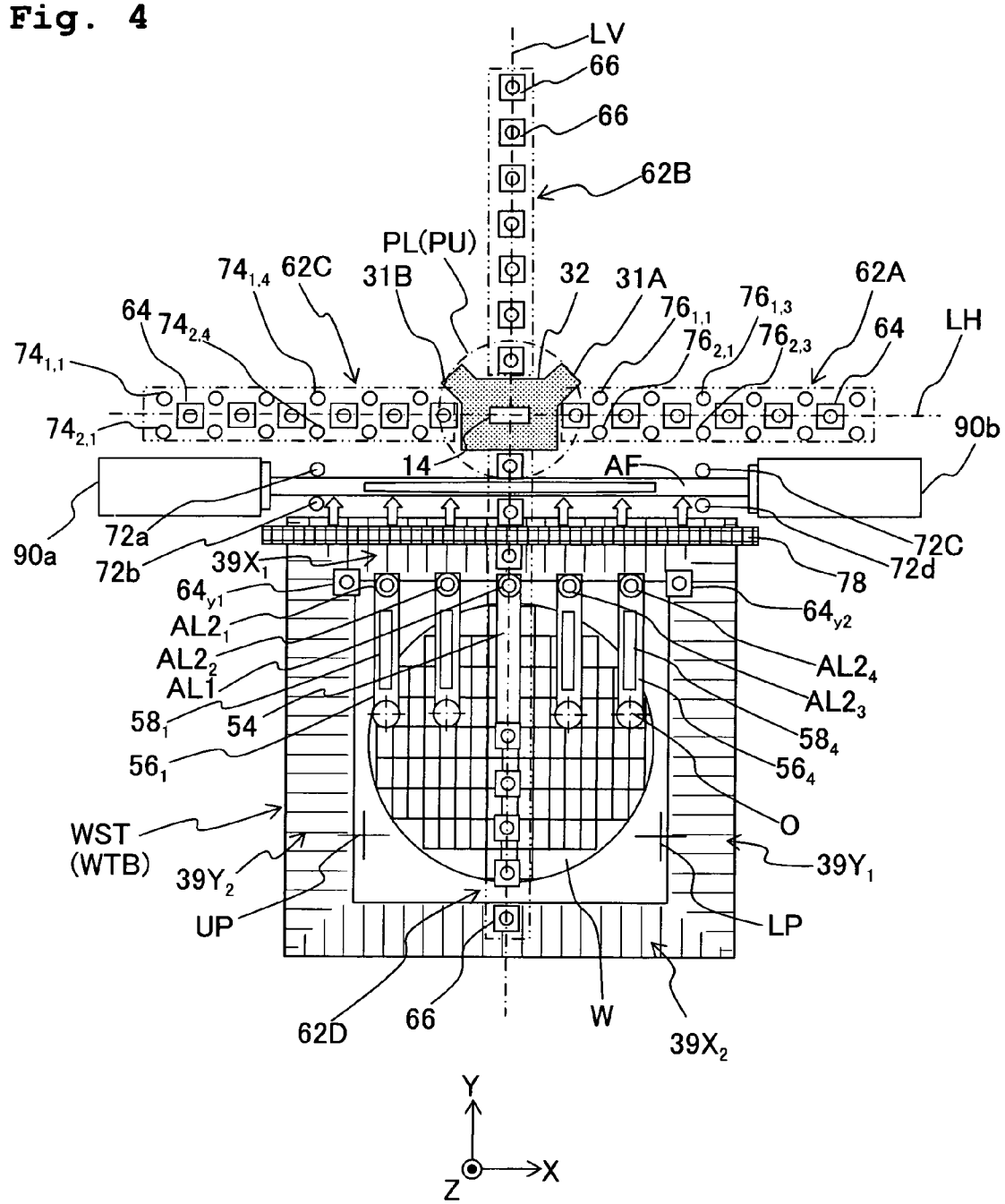
FIG. 4 is a view of an arrangement of position-measuring encoders and alignment systems AL1, AL2$_1$ to AL2$_4$ in relation to FIG. 1.

Although the illustration is omitted for preventing FIG. 1 from being complicated in relation to the exposure apparatus 100 of this embodiment, a primary alignment system AL1 is actually arranged as shown in FIG. 4. The primary alignment system AL1 has the detection center at a position separated and away by a predetermined distance on the −Y side from the optical axis, on a straight line LV that is parallel to the Y axis and passes through the center of the projection unit PU (optical axis AX of the projection optical system PL; coincident with the center of the exposure area IA described above in this embodiment as well). The primary alignment system AL1 is fixed to the lower surface of the unillustrated main frame via a support member 54. Secondary alignment systems $AL2_1$, $AL2_2$ and secondary alignment systems $AL2_3$, $AL2_4$, of which detection centers are arranged approximately symmetrically in relation to the straight line LV, are provided on one side and the other side respectively in the X axis direction with the primary alignment system AL1 being interposed therebetween. That is, the five alignment systems AL1, $AL2_1$ to $AL2_4$ are arranged such that the detection centers thereof are arranged at the different positions in relation to the X axis direction. That is, the alignment systems AL1 and $AL2_1$ to $AL2_4$ are arranged in the X axis direction.

As represented by the secondary alignment system $AL2_4$, each of the secondary alignment systems $AL2n$ (n=1 to 4) is fixed to an end portion (rotation end) of an arm $56n$ (n=1 to 4) which is rotatable within a predetermined angle range in the clockwise direction and in the counterclockwise direction about the center of the rotation center O as viewed in FIG. 4. In this embodiment, a part of each of the secondary alignment systems $AL2n$ (including, for example, at least an optical system for radiating the alignment light (alignment light beam) onto a detecting area and guiding, to a light-receiving element, the light (light beam) generated from an objective mark in the detecting area) is fixed to the arm 56n, and the remaining part of each of the secondary alignment systems AL2n is provided on the main frame holding the projection unit PU. Each of the secondary alignment systems AL2$_1$ to AL2$_4$ is rotated about the center of the rotation center O, to thereby adjust the X position. That is, the detecting areas (or the detection centers) of the secondary alignment systems AL2$_1$ to AL2$_4$ are independently movable in the X axis direction. Therefore, as for the primary alignment system AL1 and the secondary alignment systems AL2$_1$ to AL2$_4$, the relative positions of the detecting areas are adjustable in relation to the X axis direction. In this embodiment, although the X positions of the secondary alignment systems AL2$_1$ to AL2$_4$ are adjusted in accordance with the rotation of the arms, there is no limitation thereto. It is also allowable to provide a driving mechanism for reciprocating each of the secondary alignment systems AL2$_1$ to AL2$_4$ in the X axis direction. Further, at least one of the secondary alignment systems AL2$_1$ to AL2$_4$ may be movable not only in the X axis direction but also in the Y axis direction. Since a part of each of the secondary alignment systems AL2n is moved by the arm 56n, the position information of the part fixed to the arm 56n is measurable, for example, by an unillustrated sensor, for example, an interferometer or an encoder. It is enough that the sensor measures only the position information in the X axis direction of the secondary alignment system AL2n. However, the sensor may be also capable of measuring the position information in any direction other than the X-axis direction, for example, such as the Y axis direction and/or the direction of rotation (including at least one of the θx and θy directions).

Vacuum pads 58n (n=1 to 4), each of which is constructed of an air bearing of the differential evacuation type, are provided on the upper surfaces of each of the arms 56n. The arm 56n is rotatable in response to an instruction of the main controller 20, for example, by a rotary driving mechanism 60n (n=1 to 4, see FIG. 7) including, for example, a motor. After adjusting the rotation of the arms 56n, the main controller 20 operates the respective vacuum pads 58n to attract and fix the respective arms 56n to the unillustrated main frame. Accordingly, the states of the respective arms 56n after the adjustment of the angles of rotation, i.e., the desired positional relationships of the primary alignment system AL1 and the four secondary alignment systems AL2$_1$ to AL2$_4$ are maintained. Specific adjustment of the rotation of the respective arms, i.e., a method for adjusting the relative positions of the four secondary alignment systems AL2$_1$ to AL2$_4$ with respect to the primary alignment system AL1 will be described later on.

An electromagnet may be adopted in place of the vacuum pad 58n, provided that a portion of the main frame opposed to the arm 56n is constructed of a magnetic member.

In this embodiment, for example, an FIA (Field Image Alignment) system is used as each of the primary alignment system AL1 and the four secondary alignment systems AL2$_1$ to AL2$_4$. In the FIA system, a broad band detecting light flux, which does not photosensitize the resist on the wafer, is radiated onto an objective mark, and an image of the objective mark focused on a light-receiving plane by the reflected light from the objective mark and an image of an unillustrated index (index pattern on an index plate provided in each of the alignment systems) are photographed or imaged by using an image pickup element (CCD or the like) to output the image pickup signals of the images respectively; and the image pickup signals, obtained from the primary alignment system AL1 and the four secondary alignment systems AL2$_1$ to AL2$_4$ respectively, are supplied to the main controller 20 shown in FIG. 7.

Each of the alignment systems described above is not limited to the FIA system. It is of course possible to use an alignment sensor singly or alignment sensors appropriately in combination, for example, such that a coherent detecting light is radiated onto an objective mark, and a scattered light beam (scattered light) or a diffracted light beam (diffracted light) generated from the objective mark is detected, or two diffracted light beams generated from the objective mark (for example, diffracted light beams having a same order or diffracted light beams diffracted in a same direction) are allowed to interfere to effect the detection. In this embodiment, the five alignment systems AL1, AL2$_1$ to AL2$_4$ are provided. However, the number of the alignment systems is not limited to five, and may be not less than two and not more than four. Alternatively the number may be not less than six. The number may be even not limited to odd number. Further, in this embodiment, although the five alignment systems AL1, AL2$_1$ to AL2$_4$ are fixed to the lower surface of the main frame which holds the projection unit PU via the support member 54, there is no limitation thereto. For example, the five alignment systems AL1, AL2$_1$ to AL2$_4$ may be provided on the measuring frame described above.

In the exposure apparatus 100 of this embodiment, as shown in FIG. 4, four head units 62A to 62D of the encoder system are arranged in a state that the nozzle unit 32 described above are surrounded by the four head units 62A to 62D on the four sides respectively. Although support members are omitted from the illustration for preventing the drawing from being complicated, for example, in FIG. 4, the head units 62A to 62D are actually fixed to the main frame holding the projection unit PU described above via the support members in a hanging state that the head units 62A to 62D hang from the main frame. For example, when the projection unit PU is supported in the hanging manner, the head units 62A to 62D may be supported in the hanging manner integrally with the projection unit PU. Alternatively, the head units 62A to 62D may be provided on the measuring frame described above.

The head units 62A, 62C are arranged on the +X side and the −X side of the projection unit PU respectively to extend in the X axis direction, approximately at a same distance from the optical axis AX symmetrically in relation to the optical axis AX of the projection optical system PL. On the other hand, the head units 62B, 62D are arranged on the +Y side and the −Y side of the projection unit PU respectively to extend in the Y axis direction, approximately at a same distance from the optical axis AX of the projection optical system PL.

As shown in FIG. 4, each of the head units 62A, 62C is provided with a plurality of (six in this case) Y heads 64 arranged in the X axis direction at predetermined intervals on a straight line LH which passes through the optical axis AX of the projection optical system PL and which is parallel to the X axis. The head unit 62A constitutes a multilens (six-lens in this case) Y linear encoder (hereinafter appropriately abbreviated as "Y encoder" or "encoder") 70A (see FIG. 7) which measures a position (Y position) of the wafer stage WST (wafer table WTB) in the Y axis direction by using the Y scale 39Y$_1$ described above. Similarly, the head unit 62C constitutes a multilens (six-lens in this case) Y linear encoder 70C (see FIG. 7) which measures the Y position of the wafer stage WST (wafer table WTB) by using the Y scale 39Y$_2$ described above. Adjoining or adjacent Y heads 64 among the Y heads 64 (i.e., the measuring beams), which are provided for each of the head units 62A, 62C, have a spacing distance which is set to be narrower than the width in the X axis direction of the Y scales 39Y₁, 39Y₂ described above (more correctly, the length of the grating line 38). Y heads 64, among the plurality of Y heads 64 provided for each of the head units 62A, 62C, which are positioned on the innermost side are fixed to a lower end portion of the barrel 40 of the projection optical system PL (more correctly, on the lateral side of the nozzle unit 32 to surround the end lens 191) in order to arrange the innermost Y heads 64 closely as much as possible to the optical axis of the projection optical system PL.

As shown in FIG. 4, the head unit 62B is provided with a plurality of (seven in this case) X heads 66 arranged at predetermined intervals in the Y axis direction on the straight line LV. The head unit 62D is provided with a plurality of (eleven in this case) X heads 66 (although three of eleven X heads 66 overlapping with the primary alignment system AL1 are not shown in FIG. 4) arranged at predetermined intervals on the straight line LV. The head unit 62B constitutes a multilens (seven-lens in this case) X linear encoder (hereinafter appropriately abbreviated as "X encoder" or "encoder") 70B (see FIG. 7) which measures a position (X position) of the wafer stage WST (wafer table WTB) in the X axis direction by using the X scale 39X₁ described above. Further, the head unit 62D constitutes a multilens (eleven-lens in this case) X linear encoder 70D (see FIG. 7) which measures the X position of the wafer stage WST (wafer table WTB) by using the X scale 39X₂ described above. In this embodiment, for example, when alignment is performed as described later on, two X heads 66 among the eleven X heads 66 provided for the head unit 62D, are simultaneously opposed to the X scale 39X₁ and the X scale 39X₂ respectively in some cases. In such a situation, the X linear encoder 70B is constructed by the X scale 39X₁ and one X head 66 opposed thereto, and the X linear encoder 70D is constructed by the X scale 39X₂ and the other X head 66 opposed thereto.

Here, a part of the eleven X heads 66, i.e., three X heads in this case are attached at a position under or below the support member 54 of the primary alignment system AL1. The spacing distance between the adjacent X heads 66 (length-measuring beams) provided on the head units 62B, 62D respectively is set to be narrower than the width in the Y axis direction of the X scales 39X₁, 39X₂ (more correctly, the length of the grating line 37). X heads 66, which are positioned on the innermost side among the plurality of X heads 66 provided for each of the head units 62B, 62D respectively, are fixed to the lower end portion of the barrel of the projection optical system PL (more correctly, on the lateral side of the nozzle unit 32 to surround the end lens 191) in order to arrange the innermost X heads 66 closely as much as possible to the optical axis of the projection optical system PL.

Further, Y heads 64y₁, 64y₂, which are arranged on a straight line, that is parallel to the X axis and passes through the detection center of the primary alignment system AL1, and of which detecting points are arranged approximately symmetrically in relation to the detection center, are provided on the −X side of the secondary alignment system AL2₁ and the +X side of the secondary alignment system AL2₄, respectively. The spacing distance between the Y heads 64y₁, 64y₂ is set to be approximately equal to the distance L described above. The Y heads 64y₁, 64y₂ are opposed to the Y scales 39y₂, 39y₁ respectively in the state shown in FIG. 4 that the center of the wafer W on the wafer stage WST is disposed on the straight line LV. For example, when the alignment operation is performed as described later on, the Y scales 39Y₂, 39Y₁ are arranged to oppose to the Y heads 64y₁, 64Y₂, respectively. The Y position (as well as the θz rotation) of the wafer stage WST is measured by the Y heads 64y₁, 64y₂ (i.e., the Y encoders 70C, 70A constructed by the Y heads 64y₁, 64y₂).

In this embodiment, for example, when the baseline is measured by the secondary alignment system as described later on, then the pair of reference gratings 52 of the CD bar 46 are opposed to the Y heads 64y₁, 64y₂ respectively, and the Y position of the CD bar 46 is measured at the positions of the respective reference gratings 52 by the Y heads 64y₁, 64y₂ and the reference gratings 52 opposite to the Y heads 64y₁, 64y₂. In the following description, the encoders, which are constructed by the Y heads 64y₁, 64y₂ opposite to the reference gratings 52 respectively, are referred to as "Y axis linear encoders 70E, 70F" (see FIG. 7).

The measured values obtained by the six linear encoders 70A to 70F described above are supplied to the main controller 20. The main controller 20 controls the position of the wafer table WTB in the XY plane based on the measured values of the linear encoders 70A to 70D. Further, the main controller 20 controls the rotation of the CD bar 46 in the θz direction based on the measured values of the linear encoders 70A to 70D.

In the exposure apparatus 100 of this embodiment, as shown in FIG. 4, a multi-point focus position-detecting system based on the oblique incidence system (hereinafter abbreviated as "multi-point AF system") is provided, which is constructed of a light-emitting system 90a and a light-receiving system 90b and which is constructed in the same manner as a system disclosed, for example, in Japanese Patent Application Laid-open No. 6-283403 (corresponding to the specification of U.S. Pat. No. 5,448,332). In this embodiment, for example, the light-emitting system 90a is arranged on the −Y side at the −X end of the head unit 62C described above; and the light-receiving system 90b is arranged on the −Y side at the +X end of the head unit 62A described above in a state that the light-receiving system 90b is opposite to or facing the light-emitting system 90a.

A plurality of detecting points of the multi-point AF system (90a, 90b) shown in FIG. 4 are arranged at predetermined intervals in the X axis direction on a detection-objective plane or surface. In this embodiment, for example, the plurality of detecting points are arranged in a matrix form of one row and M columns (M represents the total number of the detecting points) or two rows and N columns (N represents ½ of the total number of the detecting points). In FIG. 4, the plurality of detecting points, onto which the detecting lights are radiated respectively, are not shown individually; rather, the plurality of detecting points are depicted as a slender detecting area AF which extends in the X axis direction between the light-emitting system 90a and the light-receiving system 90b. The detecting area AF has a length in the X axis direction which is set to be equivalent to the diameter of the wafer W. Therefore, when the wafer W is scanned only once in the Y axis direction, it is possible to measure the position information (surface position information) in the Z axis direction on approximately the entire surface of the wafer W. The detecting area AF is arranged between the liquid immersion area 14 (exposure area IA) described above and the detecting area of the alignment system (AL1, AL2₁ to AL2₄) in relation to the Y axis direction. Therefore, it is possible to concurrently perform the detecting operations of the multi-point AF system and the alignment system. It is also allowable that the multi-point AF system is provided, for example, on the main frame holding the projection unit PU. However, in this embodiment, the multi-point AF system is provided on the measuring frame described above.

The plurality of detecting points are arranged in one row and M columns or in two rows and N columns. However, the number of row or rows and/or the number of column or columns is not limited thereto. However, when the number of rows is not less than 2, it is preferable that the position of the detecting point in the X axis direction differs between the different rows as well. Further, although the plurality of detecting points are arranged in the X axis direction, there is no limitation thereto. All or a part of the plurality of detecting points may be arranged at different positions in relation to the Y axis direction.

The exposure apparatus 100 of this embodiment is provided with a pair of Z position-measuring surface position sensors (hereinafter abbreviated as "Z sensors") 72a, 72b and a pair of Z position-measuring surface position sensors 72c, 72d which are arranged symmetrically in relation to the straight line LV described above in the vicinity of the detecting points positioned, at the both ends, respectively, of the plurality of detecting points of the multi-point AF system, i.e., in the vicinity of the both ends of the detecting area AF respectively. The Z sensors 72a to 72d are fixed to the lower surface of the unillustrated main frame. Those used as the Z sensors 72a to 72d include a sensor which measures the position information of the surface of the wafer table WTB in the Z axis direction perpendicular to the XY plane, at the radiation point of the light beam, by radiating the light from a position above the wafer table WTB onto the wafer table WTB and receiving the reflected light thereof, such as, for example an optical displacement sensor (sensor based on the CD pickup system) having a construction similar to that of an optical pickup to be used, for example, for a CD drive unit, etc. The Z sensors 72a to 72d may be provided, for example, on the measuring frame described above.

Further, the head unit 62C described above is provided with a plurality of Z sensors $74_{i,j}$ (i=1, 2, j=1, 2, . . . , 6) which are arranged at predetermined intervals on two straight lines (six on each of the two lines in this case, twelve in total), the two lines being parallel to the straight line LH respectively and which are positioned on one side and the other side while interposing the straight line LH in the X axis direction connecting the plurality of Y heads 64. In this case, the Z sensors $74_{1,j}$, $74_{2,j}$, which form the pair, are arranged symmetrically in relation to the straight line LH. Further, a plurality of pairs (six pairs in this case) of the Z sensors $74_{1,j}$, $74_{2,j}$ and the plurality of Y heads 64 are arranged alternately in relation to the X axis direction. For example, a sensor based on the CD pickup system is used for each of the Z sensors $74_{i,j}$ in the same manner as the Z sensors 72a to 72d described above.

The spacing distance between the Z sensors $74_{1,j}$, $74_{2,j}$ of each of the pairs disposed at the symmetrical positions in relation to the straight line LH is set to be the same as the spacing distance between the Z sensors 72c, 72d described above. Further, the pair of Z sensors $74_{1,4}$, $74_{2,4}$ are arranged on a straight line parallel to the Y axis direction same as a straight line on which the Z sensors 72a, 72b are arranged.

The head unit 62A described above is provided with a plurality of (twelve in this case) Z sensors $76_{p,q}$ (P=1, 2, q=1, 2, . . . , 6) which are arranged symmetrically with respect to the plurality of Z sensors $74_{i,j}$ described above in relation to the straight line LV described above. A sensor based on the CD pickup system is used for each of the Z sensors $76_{p,q}$ in the same manner as the Z sensors 72a to 72d described above. Further, the pair of Z sensors $76_{1,3}$, $76_{2,3}$ are arranged on a straight line in the Y axis direction same as a straight line on which the Z sensors 72c, 72d are arranged.

In FIG. 4, the measuring stage MST is omitted from the illustration. Further, the liquid immersion area, which is formed by water Lq held or retained between the measuring stage MST and the end lens 191, is depicted by a reference numeral 14. In FIG. 4, a reference numeral 78 indicates a local air conditioning system which feeds dry air, temperature-adjusted to have a predetermined temperature, for example, in a down flow as indicated by blanked arrows shown in FIG. 4, toward the vicinity of the beam path of the multi-point AF system (90a, 90b). The symbol "UP" indicates an unloading position at which the wafer on the wafer table WTB is unloaded, and a symbol "LP" indicates the loading position at which the wafer is loaded onto the wafer table WTB. In this embodiment, the unloading position UP and the loading position LP are defined symmetrically in relation to the straight line LV. In the embodiment, although an exchange position at which the wafer W is exchanged is set separately as the unloading position UP and the loading position LP, the unloading position UP and the loading position LP may be an identical position. The operation for moving the liquid immersion area 14 between the wafer stage WST and the measuring stage MST and the measuring operation of the measuring stage MST during the exchange of the substrate are omitted. However, these operations are disclosed, for example, in the specification of European Patent Application Publication No. 1713113, International Publication No. 2006/013806, etc.

FIG. 7 shows the main constitutive components of the control system of the exposure apparatus 100. The control system is constructed such that the main controller 20, constructed of a microcomputer (or a work station) for integrally controlling the apparatus as a whole, is the central unit of the control system. In FIG. 7, various sensors provided for the measuring stage MST, and including, for example, the uneven illuminance sensor 94, the spatial image-measuring device 96, and the wave aberration measuring device 98 described above, are collectively depicted as a sensor group 99.

Figure 8A:
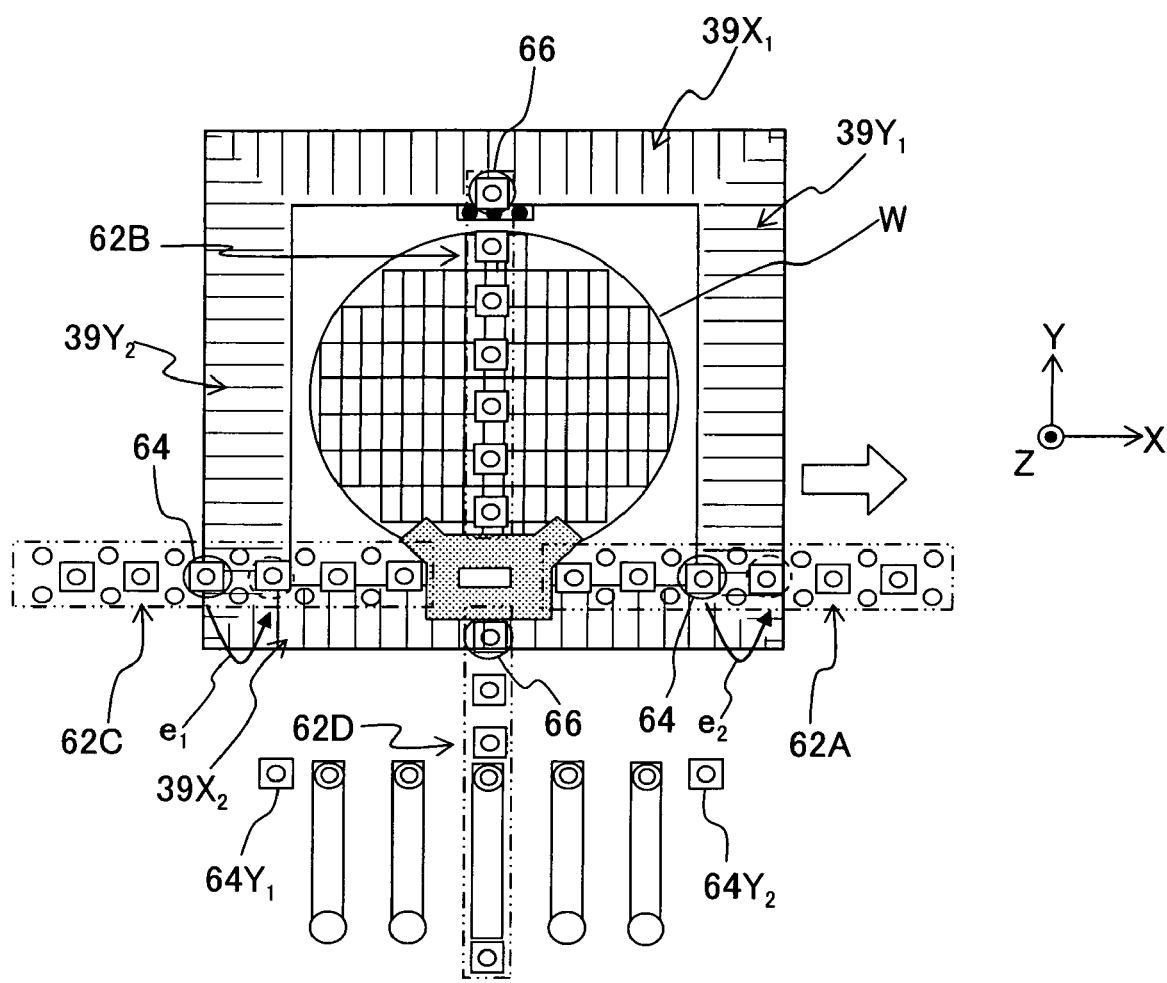

The exposure apparatus 100 of this embodiment constructed as described above adopts the construction of the X scales and the Y scales on the wafer table WTB as described above and the construction of the X heads and the Y heads as described above. Therefore, as shown in FIGS. 8A and 8B by way of example, the X scales $39X_1$, $39X_2$ and the head units 62B, 62D (X heads 66) are always or necessarily opposed to or facing one another respectively, and the Y scales $39Y_1$, $39Y_2$ and the head units 62A, 62C (Y heads 64) or the Y heads $64y_1$, $64y_2$ are always or necessarily opposed to or facing one another respectively in an effective stroke range of the wafer stage WST (i.e., a range of the movement for the alignment and the exposure operation in this embodiment). In FIGS. 8A and 8B, the heads, which correspond to the X scales or the Y scales, are depicted as being surrounded by circles.

Therefore, the main controller 20 controls each of the motors constructing the stage-driving system 124 based on at least three measured values of the encoders 70A to 70D in the effective stroke range of the wafer stage WST described above, thereby making it possible to highly accurately control the position information in the XY plane of the wafer stage WST (including the information about the rotation in the θz direction). The influence of the air fluctuation, which affects the measured values of the encoders 70A to 70D, is small to such an extent that the influence is negligible, as compared with the interferometer. Therefore, the short-term stability of the measured value, which would be otherwise fluctuated resulting from the air fluctuation, is extremely excellent as compared with the interferometer. In this embodiment, the sizes of the head units 62B, 62D, 62A, 62C (for example, the number and/or the interval of the heads) are set depending on the effective stroke range of the wafer stage WST, the size of the scale (i.e., the range of formation of the diffraction grating), etc. Therefore, all of the four scales $39X_1$, $39X_2$, $39Y_1$, $39Y_2$ are opposed to the head units 62B, 62D, 62A, 62C respectively in the effective stroke range of the wafer stage WST. However, it is also allowable that not all of the four scales are opposed to the corresponding head units. For example, one of the X scales $39X_1$, $39X_2$ and/or one of the Y scales $39Y_1$, $39Y_2$ may be offset or shifted from the head unit. When one of the X scales $39X_1$, $39X_2$ or one of the Y scales $39Y_1$, $39Y_2$ is offset or shifted from the head unit, the three scales are opposed to the head units in the effective stroke range of the wafer stage WST. Therefore, it is possible to always measure the position informations of the wafer stage WST in the X axis direction, the Y axis direction, and the θz direction. When one of the X scales $39X_1$, $39X_2$ and one of the Y scales $39Y_1$, $39Y_2$ are deviated from the head units, the two scales are opposed to the head units in the effective stroke range of the wafer stage WST. Therefore, it is possible to always measure the position informations in the X axis direction and the Y axis direction, although it is impossible to always measure the position information of the wafer stage WST in the θz direction. In this situation, the position of the wafer stage WST may be controlled by using, in combination with the measurement of the position informations in the X axis direction and the Y axis direction, the position information of the wafer stage WST in the θz direction measured by the interferometer system 118.

When the wafer stage WST is driven in the X axis direction as shown by a blanked arrow in FIG. 8A, a Y head 64, which measure the position of the wafer stage WST in the Y axis direction, is successively switched to another Y head 64 adjacent to the Y head 64, as indicated each by arrows $e_1$, $e_2$ in FIG. 8A. For example, a Y head 64, which detects a Y scale $39Y_1$, is switched from the Y head 64 surrounded by the solid line circle to another Y head 64 surrounded by the broken line circle. Therefore, the measured value is successively transferred before and after the switching. That is, in this embodiment, the spacing distance between the Y adjacent heads provided for the head units 62A, 62C is set to be narrower than the width in the X axis direction of the Y scale $39Y_1$, $39Y_2$ as described above, in order to smoothly perform the switching of the Y heads and the successive transfer of the measured value.

In this embodiment, as described above, the spacing distance between the adjacent X heads provided for the head units 62B, 62D is set to be narrower than the width in the Y axis direction of the X scale $39X_1$, $39X_2$ described above. Therefore, in the same manner as described above, when the wafer stage WST is driven in the Y axis direction as shown by a blanked arrow in FIG. 8B, certain X heads 66, which measure the position of the wafer stage WST in the X axis direction, are successively switched to another X heads 66 adjacent to the certain X heads 66 respectively (for example, an X head 66, which detects the X scale $39X_1$, is switched from the X head 66 surrounded by the solid line circle to another X head 66 surrounded by the broken line circle). The measured value is successively transferred before and after the switching.

Figure 9A:
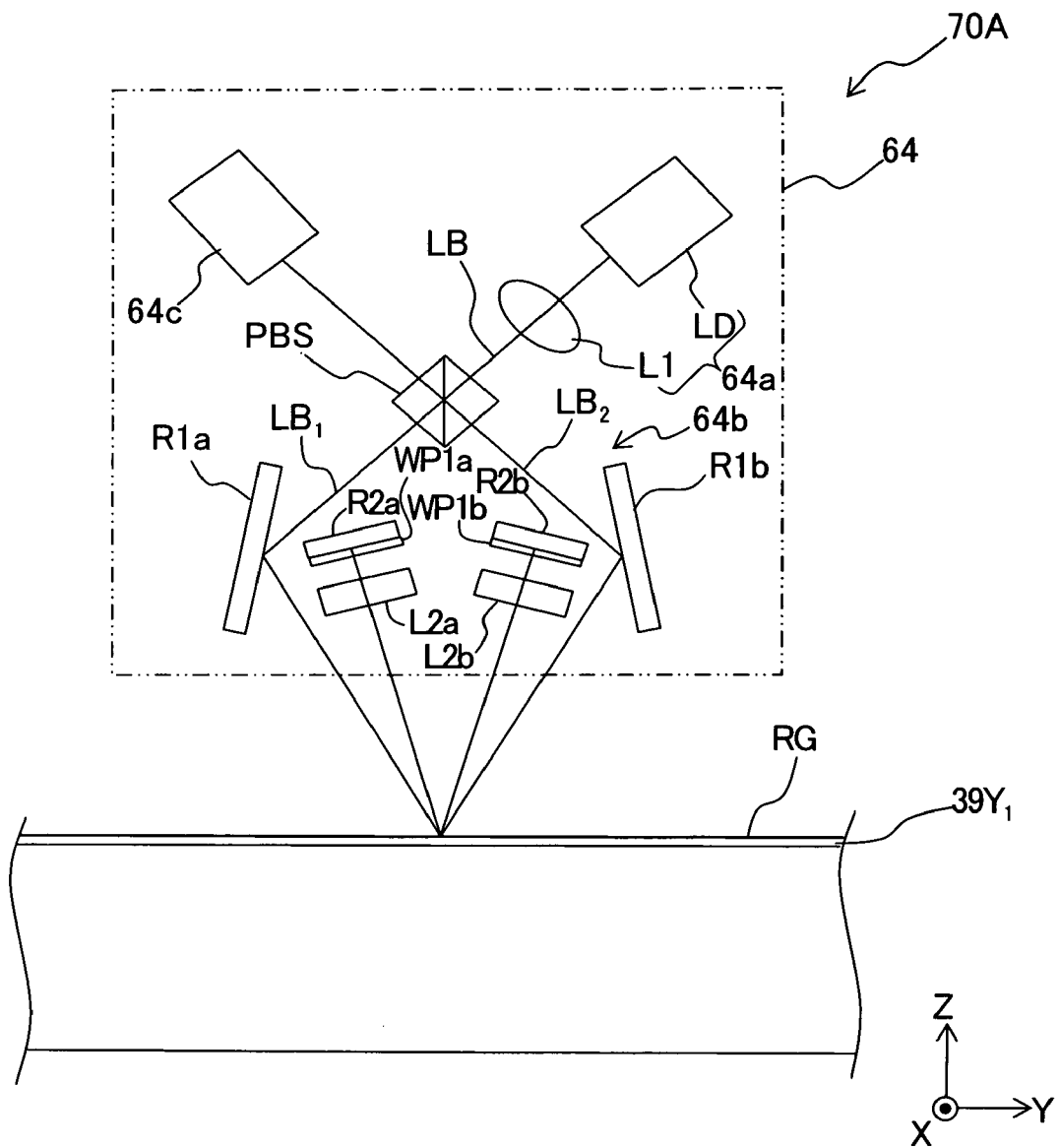
FIG. 9A shows an exemplary arrangement of the encoder.

Next, an explanation will be made about the construction of the encoders 70A to 70F, etc., as representatively exemplified by the Y encoder 70A depicted in a magnified manner in FIG. 9A. FIG. 9A shows one of Y heads 64 of the head unit 62A for radiating the detecting light (measuring light or measuring light beam) onto the Y scale $39Y_1$.

The Y head 64 is roughly constructed of three components, namely, a light-emitting system 64a, an optical system 64b, and a light-receiving system 64c. The light-emitting system 64a includes a light source, for example, a semiconductor laser LD, which radiates a laser beam LB in a direction to form 45° with respect to the Y axis and the Z axis, and a lens L1 which is arranged on the optical path for the laser beam LB emitted from the semiconductor laser LD. The optical system 64b includes a polarization beam splitter PBS which has a splitting surface parallel to the XZ plane, a pair of reflecting mirrors R1a, R1b, lenses L2a, L2b, ¼ wavelength plates (hereinafter referred to as "λ/4 plates") WP1a, WP1b, reflecting mirrors R2a, R2b, and the like.

The light-receiving system 64c includes a polarizer (analyzer), a photodetector and the like. In the Y encoder 70A, the laser beam LB, emitted from the semiconductor laser LD, comes into the polarization beam splitter PBS via the lens L1, and the laser beam LB is polarized and split into two beams $LB_1$, $LB_2$. The beam $LB_1$, transmitted through the polarization beam splitter PBS, arrives, via the reflecting mirror R1a, at the reflection type diffraction grating RG formed on the Y scale $39Y_1$. The beam $LB_2$, reflected by the polarization beam splitter PBS, arrives, via the reflecting mirror R1b, at the reflection type diffraction grating RG. The term "polarization split" herein means that the incident beam is split or separated into the P-polarization component and the S-polarization component.

The diffracted light beams having a predetermined order, for example, the 1st-order diffracted light beams, generated from the diffraction grating RG by being irradiated with the beams $LB_1$, $LB_2$, are allowed to pass through the lenses L2b, L2a respectively, and the beams $LB_1$, $LB_2$ are converted into circularly polarized light beams by the λ/4 plates WP1b, WP1a, respectively. After that, the light beams are reflected by the reflecting mirrors R2b, R2a, and are allowed to pass through the λ/4 plates WP1b, WP1a again to arrive at the polarization beam splitter PBS, traveling in the same optical paths as those of the outward trip routes, in the opposite or reverse directions. Each of the two beams, arriving at the polarization beam splitter PBS, has the direction of polarization rotated, by 90 degrees as compared with the original direction. Therefore, the 1st-order diffracted light beam of the beam $LB_1$, which has been previously transmitted through the polarization beam splitter PBS, is reflected by the polarization beam splitter PBS to come into the light-receiving system 64c; and the 1st-order diffracted light beam of the beam $LB_2$, which has been previously reflected by the polarization beam splitter PBS, is transmitted through the polarization beam splitter PBS, and is coaxially combined with the 1st-order diffracted light beam of the beam $LB_1$ to come into the light-receiving system 64c. The two 1st-order diffracted light beams have the directions of polarization which are aligned by the analyzer in the light-receiving system 64c, and the two 1st-order diffracted light beams are allowed to interfere with each other to be an interference light beam. The interference light beam is detected by the photodetector, and is converted into an electric signal depending on the intensity of the interference light beam.

Figure 9B:
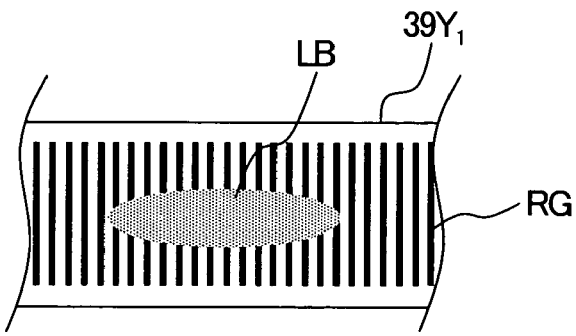
FIG. 9B shows a case wherein a laser beam LB, which has a cross-sectional shape elongated in the periodic direction of a grating RG, is used as a detecting light.

As appreciated from the foregoing explanation, in the Y encoder 70A, the optical path lengths of the two beams made to interfere are extremely short respectively, and are approximately equal to each other. Therefore, the influence exerted by the air fluctuation is almost negligible. When the Y scale $39Y_1$ (i.e., the wafer stage WST) is moved in the measuring direction (in the Y axis direction in this case), then the phases of the two beams are changed respectively, and the intensity of the interference light beam is changed. The change of the intensity of the interference light beam is detected by the light-receiving system 64c, and a position information corresponding to the intensity change is outputted as the measured value of the Y encoder 70A. The other encoders 70B, 70C, 70D, etc. are constructed in the same manner as the encoder 70A. An encoder, which has a resolution of, for example, about 0.1 nm, is used as each of the encoders. In the case of the encoder of this embodiment, as shown in FIG. 9B, it is also allowable to use, as the detecting light, a laser beam LB having a cross-sectional shape which is elongated in the periodic direction of the grating RG. In FIG. 9B, the beam LB is exaggerated and depicted largely as compared with the grating RG.

The scale of the encoder is unstable in view of the long-term mechanical stability, for example, such that the diffraction grating is deformed in some cases and/or the pitch of the diffraction grating is partially or entirely changed in other cases due to the thermal expansion or any other cause as the time of use elapses. Therefore, an error, which is contained in the measured value, is increased as the time of use elapses. Therefore, it is necessary to correct the error. In this case, when the Y axis interferometer 16 and the X axis interferometer 126 shown in FIG. 2 are used, it is possible to measure the Y position and the X position of the wafer table WTB without any Abbe error.

Accordingly, the wafer stage WST is moved in the +Y direction, for example, until the other ends (each one end on the −Y side) of the Y scales $39Y_1$, $39Y_2$ are coincident with the corresponding head units 62A, 62C respectively (within the effective stroke range described above), while maintaining all of the pitching amount, the rolling amount, and the yawing amount to be zero, based on the measured values of the Y axis interferometer 16 and the Z sensors $74_{1,4}$, $74_{2,4}$, $76_{1,3}$, $76_{2,3}$ shown in FIG. 4, while fixing the measured value of the X axis interferometer 126 to a predetermined value, and at a low velocity to such an extent that the short-term fluctuation of the measured value of the Y axis interferometer 16 is negligible. During the movement, the main controller 20 incorporates the measured values of the Y linear encoders 70A, 70C shown in FIG. 7 and the measured value of the Y axis interferometer 16 at predetermined sampling intervals to determine the relationship between the measured values of the Y linear encoders 70A, 70C and the measured value of the Y axis interferometer 16 based on the incorporated measured values. According to this relationship, it is possible to correct any error contained in the measured values of the Y linear encoders 70A, 70C.

Similarly, it is possible to correct any error of the measured values of the X linear encoders 70B, 70D by using the X axis interferometer 126.

Figure 10A:
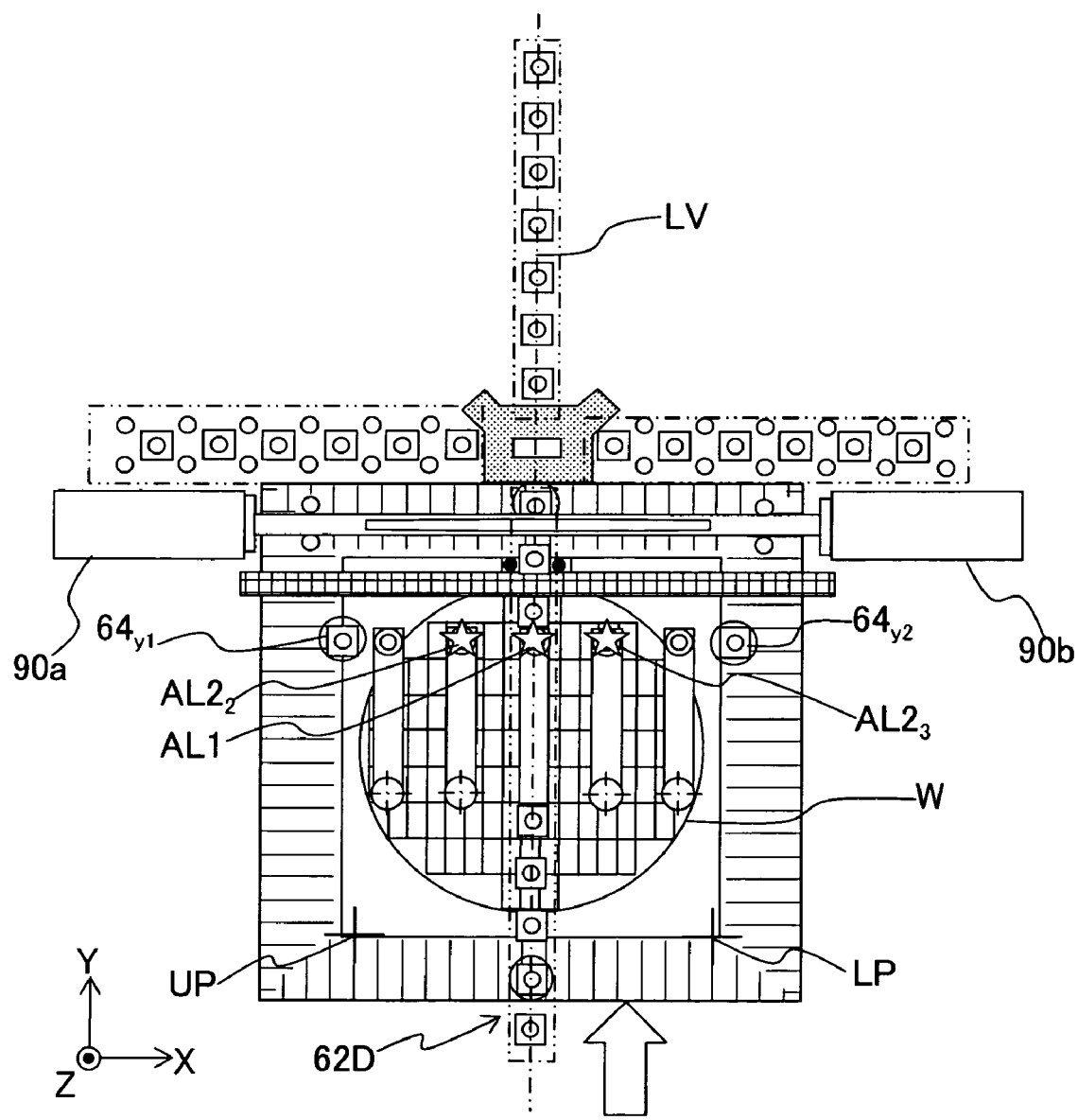
FIG. 10A shows a state that first alignment shots AS are measured.
Figure 10B:
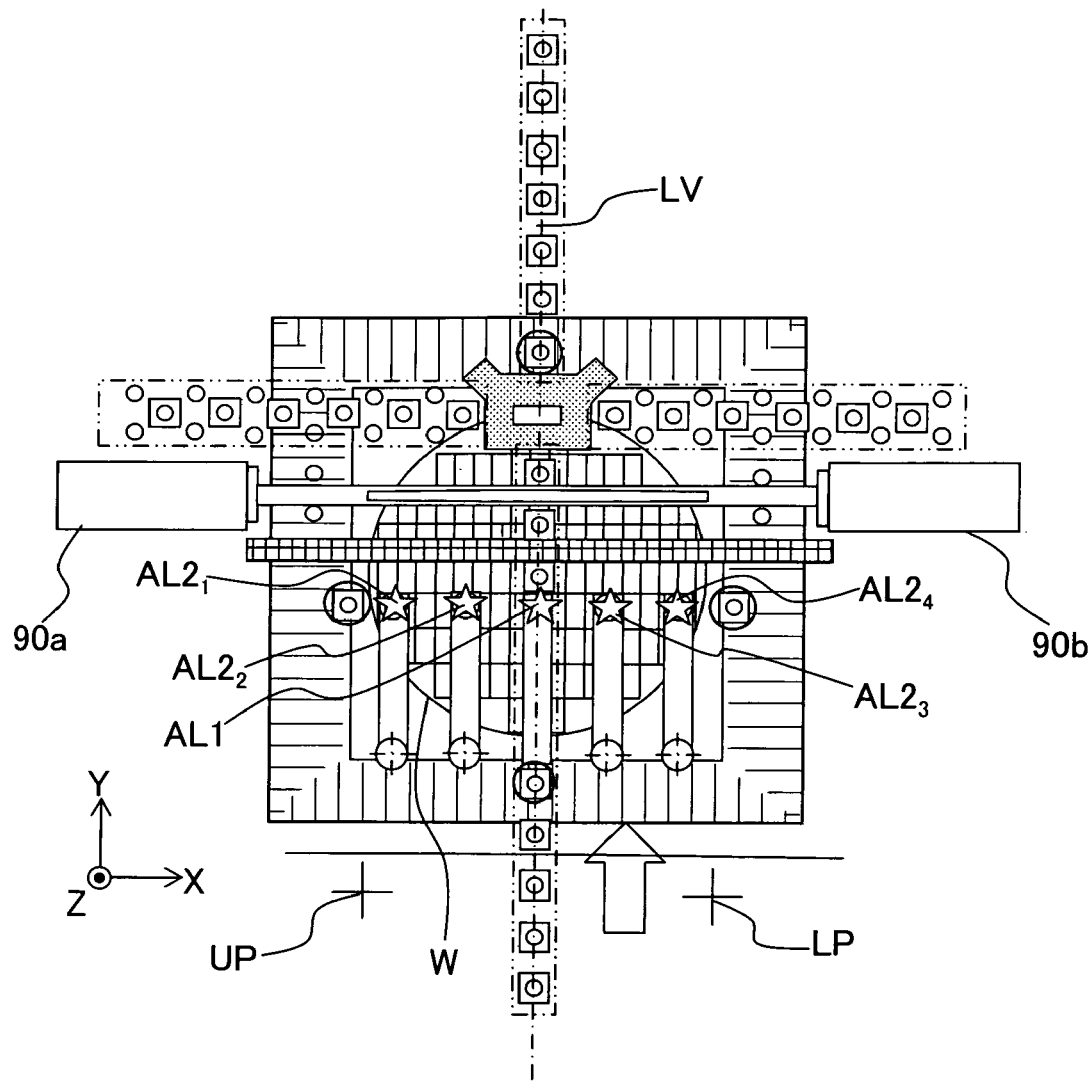
FIG. 10B shows a state that second alignment shots AS are measured.

Next, a brief description will be made with reference to FIGS. 10A to 10C about the wafer alignment performed in the exposure apparatus 100 of the embodiment of the present invention.

Figure 10C:
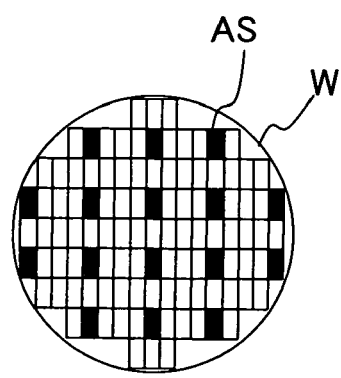
FIG. 10C shows an example of arrangement of the alignment shots AS on a wafer.

An operation will now be explained in a case that a plurality of shot areas are formed on the wafer W in the layout (shot map) shown in FIG. 10C in which sixteen shot areas AS (black areas as shown in FIG. 10C) on the wafer W are used as alignment shots. The measuring stage MST is omitted from the illustration in FIGS. 10A and 10B.

In this procedure, the coordinates of the reference marks M on the CD bar 46 on the side of the measuring stage MST shown in FIG. 6A are previously measured with the alignment systems AL1, $AL2_1$ to $AL2_4$ shown in FIG. 4, and thus the baseline amounts of the alignment systems AL1, $AL2_1$ to $AL2_4$ (positional relationships between the coordinates of the detection centers and the reference position of the image of the pattern of the reticle R shown in FIG. 1) are determined, and are stored in an alignment calculating system 20a (calculating device) shown in FIG. 7. It is premised that the alignment in the X axis direction is performed beforehand for the secondary alignment systems $AL2_1$ to $AL2_4$ in conformity with the arrangement of the alignment shots AS.

At first, the wafer stage WST, on which the center of the wafer W is positioned at the loading position LP, is moved by the main controller 20 obliquely in the upper-left direction as viewed in FIG. 10A, so that the wafer stage WST is positioned at a predetermined position (alignment start position as described later on) at which the center of the wafer W is positioned on the straight line LV. In this case, the wafer stage WST is moved by the main controller 20 by driving the respective motors of the stage-driving system 124 based on the measured value of the X encoder 70D and the measured value of the Y axis interferometer 16. In the state of being positioned at the alignment start position, the position in the XY plane (including the θz rotation) of the wafer table WTB on which the wafer W is placed is controlled based on the measured values of the two X heads 66 provided for the head unit 62D opposed to the X scales $39X_1$, $39X_2$ shown in FIG. 4 respectively and the Y heads $64y_2$, $64y_1$ opposed to the Y scales $39Y_1$, $39Y_2$ respectively (four encoders).

Subsequently, the main controller 20 moves the wafer stage WST by a predetermined distance in the +Y direction based on the measured values of the four encoders described above to position the wafer stage WST at the position shown in FIG. 10A. The primary alignment system AL1 and the secondary alignment systems $AL2_2$, $AL2_3$ are used to detect the alignment marks affixed to three first alignment shots AS among the sixteen first alignment shots AS substantially simultaneously and individually (see star marks shown in FIG. 10A). The detection results of the three alignment systems AL1, $AL2_2$, $AL2_3$ and the measured values of the four encoders upon the detection are correlated and supplied to the alignment calculating system 20a. The secondary alignment systems $AL2_1$, $AL2_4$, which are disposed at the both ends and which do not detect any alignment mark, may radiate the detecting lights or may not radiate the detecting lights onto the wafer table WTB (or the wafer). In the wafer alignment of this embodiment, the position of the wafer stage WST in the X axis direction is set so that the primary alignment system AL1 is arranged on the center line of the wafer table WTB. The primary alignment system AL detects the alignment mark of the alignment shot positioned on the meridian of the wafer. The alignment marks may be formed at the inside of the respective shot areas on the wafer W. However, in this embodiment, it is assumed that the alignment marks are formed at the outside of the respective shot areas, i.e., on the street lines (scribe lines) comparting the large number of shot areas on the wafer W.

Subsequently, the main controller 20 moves the wafer stage WST in the +Y direction by a predetermined distance based on the measured values of the four encoders to position the wafer stage WST at a position at which five alignment systems AL1, $AL2_1$ to $AL2_4$ are capable of detecting the alignment marks affixed to the five second alignment shots AS on the wafer W substantially simultaneously and individually. The five alignment systems AL1, $AL2_1$ to $AL2_4$ are used to detect the five alignment marks substantially simultaneously and individually. The detection results of the five alignment systems AL1, $AL2_1$ to $AL2_4$ and the measured values of the four encoders upon the detection are correlated and supplied to the alignment calculating system 20a.

Subsequently, the main controller 20 moves the wafer stage WST in the +Y direction by a predetermined distance based on the measured values of the four encoders to position the wafer stage WST at a position at which the five alignment systems AL1, $AL2_1$ to $AL2_4$ are capable of detecting the alignment marks affixed to five third alignment shots AS on the wafer W substantially simultaneously and individually. The five alignment systems AL1, AL2$_1$ to AL2$_4$ are used to detect the five alignment marks substantially simultaneously and individually (see star marks shown in FIG. 10B). The detection results of the five alignment systems AL1, AL2$_1$ to AL2$_4$ and the measured values of the four encoders upon the detection are correlated and supplied to the alignment calculating system 20a.

Subsequently, the main controller 20 moves the wafer stage WST in the +Y direction by a predetermined distance based on the measured values of the four encoders to position the wafer stage WST at a position at which the alignment marks affixed to three fourth alignment shots AS on the wafer W are capable of being detected substantially simultaneously and individually by using the primary alignment system AL1 and the secondary alignment systems AL2$_2$, AL2$_3$. The three alignment systems AL1, AL2$_2$, AL2$_3$ are used to detect the three alignment marks substantially simultaneously and individually. The detection results of the three alignment systems AL1, AL2$_2$, AL2$_3$ and the measured values of the four encoders upon the detection are correlated and supplied to the alignment calculating system 20a.

The alignment calculating system 20a performs the statistical calculation in accordance with the EGA system as disclosed, for example, in U.S. Pat. No. 4,780,617 (corresponding to Japanese Patent Application Laid-open No. 61-44429) by using the detection results of the sixteen alignment marks in total (see FIG. 10C) obtained as described above, the measured values of the corresponding four encoders, and the baselines of the primary alignment system AL1 and the secondary alignment systems AL2n. The arrangement coordinate (arrangement information) of all of the shot areas on the wafer W is calculated on the stage coordinate system (for example, the XY coordinate system having the origin of the optical axis of the projection optical system PL) defined by the measuring axes of the four encoders (four head units).

In this procedure, for example, in order to determine the arrangement coordinate on the stage coordinate system from the arrangement coordinate on the coordinate system on the wafer W of the alignment shot described above, the values of six parameters, which are constructed of scalings (linear expansion and contraction) (Sx, Sy) of the X axis and the Y axis, rotation θ, perpendicularity ω, and offsets (Ox, Oy) of the X axis and the Y axis, are determined by the least square method, etc. The six parameters are used to calculate, based on the following expression, the arrangement coordinate (Xf, Yf) on the stage coordinate system from the arrangement coordinate (x, y) on the coordinate system on the wafer W of each of the shot areas on the wafer W.

$$\begin{bmatrix} Xf \\ Yf \end{bmatrix} = \begin{bmatrix} 1+Sx & -(\theta+\omega) \\ \theta & 1+Sy \end{bmatrix} \begin{bmatrix} x \\ y \end{bmatrix} + \begin{bmatrix} Ox \\ Oy \end{bmatrix} \quad (1)$$

As described above, in this embodiment, the wafer stage WST is moved in the +Y direction, and the wafer stage WST is positioned at the four positions on the movement route. By doing so, the position information of the alignment marks in relation to the sixteen alignment shots AS in total can be obtained in an extremely short period of time, as compared with a case that the sixteen alignment marks are successively detected with a single alignment system. In this procedure, the feature is especially comprehensive, for example, in view of the alignment systems AL1, AL2$_2$, AL2$_3$. The alignment systems AL1, AL2$_2$, AL2$_3$ detect the plurality of alignment marks which are arranged in the Y axis direction and which are successively arranged in the detecting areas (corresponding to, for example, the irradiation areas of the detecting lights) respectively in cooperation with the operation in which the wafer stage WST is moved as described above. Therefore, when the alignment marks are measured, it is unnecessary to move the wafer stage WST in the X axis direction. When the position information of the alignment mark after the exposure is detected, it is appropriate that the wafer stage WST is moved in the −Y direction. Therefore, also in this case, it is unnecessary to move the wafer stage WST in the X axis direction. The wafer stage WST may be moved in the X axis direction upon performing the detecting operation of the alignment marks, either before or after the exposure.

Next, an explanation will be made with reference to a flow chart shown in FIG. 11 about an example of the operation to be performed when one lot of wafers are successively exposed with the pattern of the reticle R by using the exposure apparatus 100 shown in FIG. 1 of this embodiment.

At first, the 1st wafer of the lot (referred to as "wafer W") is loaded on the wafer table WTB. In order to simplify the explanation, it is now assumed that the alignment marks have been already formed on the 1st wafer as the exposure for the first layer has been completed or the predetermined processing has been performed. The wafer stage WST is driven in the +Y direction so that a predetermined number (sixteen in this case) of the alignment shots AS on the wafer W are successively positioned in the fields of the alignment systems AL1, AL2$_1$ to AL2$_4$ as shown in FIGS. 10A and 10B. Accordingly, the coordinates of the alignment marks affixed to the respective alignment shots AS are measured by the alignment systems AL1, AL2$_1$ to AL2$_4$ (Step 201 shown in FIG. 11). The measurement results and the corresponding coordinate values of the wafer stage WST (measured values of the encoders 70A to 70D) are supplied to the alignment calculating system 20a shown in FIG. 7; and the alignment calculating system 20a calculates the six parameters (Sx, Sy, θ, ω, Ox, Oy; hereinafter referred to as "parameters pi (i=1 to 6) as well) of the expression (1). The information, which includes the parameters pi of the expression (1) and the arrangement coordinates of all of the shot areas on the wafer W calculated based on the expression (1) by using the parameters, is supplied to the main controller 20.

In Step 202, for example, the main controller 20 corrects the projection magnification β of the projection optical system PL by using the image formation characteristic-correcting mechanism described above by making the adjustment to the scalings Sx, Sy. The scalings of this embodiment are the deviations with respect to the 1× magnification or 1-fold. In order to simplify the explanation, the deviations from the 1× magnification of the change ratio of the projection magnification β in the X and Y directions are designated as Mx and My respectively. As a result, when Mx and My are set as the values of the scalings Sx, Sy respectively, the projection magnification β is (1+Sx) times and (1+Sy) times in the X direction and the Y direction respectively. Therefore, at the point of time at which the exposure is started for the wafer W, the image of the pattern of the reticle R can be correctly overlaid to perform the exposure in the respective shot areas of the wafer W in which the scalings of Sx and Sy arise.

Subsequently, in Step 203, the wafer stage WST is driven based on the arrangement coordinate supplied from the alignment calculating system 20a under the control of the main controller 20. Further, all of the shot areas on the wafer W are exposed with the image of the pattern (pattern image) of the reticle R in accordance with the liquid immersion system via the projection optical system PL of which the projection magnification has been corrected in Step 202. During the exposure of the wafer W, it is feared that for example the scalings Sx, Sy may be fluctuated slightly and gradually fluctuated due to the influence of the thermal energy of the illumination light, etc. In such a situation, the overlay accuracy is gradually lowered during the exposure of the wafer W.

In particular, in the case of the liquid immersion exposure, the liquid immersion area is locally formed by the liquid on the wafer W. Therefore, for example, the heat of vaporization, etc. causes the temperature change in the wafer W, namely the deformation (expansion and contraction, etc.) of the wafer W, in some cases. This makes it difficult to predict the thermal fluctuation of the wafer W, consequently the deformation of the wafer W or the change in the EGA parameter. Further, the liquid immersion area is moved on the wafer W during the exposure operation. Therefore, there is such a possibility that any temperature distribution may be caused thereby as well.

In this embodiment, the following countermeasure is adopted against the problem as described above. That is, the coordinates of the alignment marks affixed to the respective alignment shots AS are also measured for the 1st wafer W for which the exposure has been completed, by the alignment systems AL1, $AL2_1$ to $AL2_4$ in Step 204 in the same manner as in Step 201. The results of the measurement and the corresponding coordinate values of the wafer stage WST (measured values of the encoders 70A to 70D) are supplied to the alignment calculating system 20a shown in FIG. 7. The alignment calculating system 20a determines the parameters pi (Sx, Sy, θ, ω, Ox, Oy) of the expression (1) from the results of the measurement. In Step 204, the direction of movement of the wafer W is the −Y direction, which is opposite to the direction of movement in Step 201 (+Y direction). This is because the detection of the alignment marks is performed while the wafer W, for which the exposure has been completed, is moved from the position immediately below or under the projection optical system PL (exposure position) up to the unloading position UP. Accordingly, even when the detection of the alignment marks is performed again in Step 204, it is possible to suppress the lowering of the throughput.

Subsequently, in Step 205, the alignment calculating system 20a determines, with respect to the parameters (Sx, Sy, θ, ω, Ox, Oy) of the expression (1) determined in Step 202, Δpi (i=1 to 6) as fluctuation amounts (ΔSx, ΔSy, Δθ, Δω, ΔOx, ΔOy) of the parameters (Sx, Sy, θ, ω, Ox, θy) determined in Step 204. The determined Δpi (i=1 to 6) is stored in the internal memory.

Subsequently, in Step 206, the wafer on the wafer table WTB is exchanged, and a kth (k=2, 3, . . . ) wafer is loaded on the wafer table WTB. Subsequently, in Step 207, the coordinates of the alignment marks affixed to the respective alignment shots AS of the kth wafer are measured by the alignment systems AL1, $AL2_1$ to $AL2_4$ in the same manner as in Step 201. The results of the measurement and the corresponding coordinate values of the wafer stage WST are supplied to the alignment calculating system 20a shown in FIG. 7; and the parameters pi (Sx, Sy, θ, ω, Ox, Oy) of the expression (1) are determined from the results of the measurement.

Subsequently, in Step 208, the alignment calculating system 20a adds, for example, ½ of Δpi as the fluctuation amounts (ΔSx, ΔSy, Δθ, Δω, ΔOx, ΔOy) of the parameters during the exposure stored in Step 205 (or in Step 211 as described later on) to the parameters pi (Sx, Sy, θ, ω, Ox, Oy) determined in Step 207 to determine parameters pi' (Sx', Sy', θ', ω', Ox', Oy') after the correction (corrected parameters pi') as follows.

$$Sx'=Sx+\Delta Sx/2, Sy'=Sy+\Delta Sy/2 \quad (2A)$$

$$\theta'=\theta+\Delta\theta/2, \omega'=\omega+\Delta\omega/2 \quad (2B)$$

$$Ox'=Ox+\Delta Ox/2, Oy'=Oy+\Delta Oy/2 \quad (2C)$$

The corrected parameters pi' and the arrangement coordinates of all of the shot areas of the kth wafer calculated by substituting the expression (1) with the corrected parameters pi' (Sx', Sy', θ', ω', Ox', Oy') are supplied by the alignment calculating system 20a to the main controller 20. In response to this, the main controller 20 sets, via the image formation characteristic-correcting mechanism, the deviations Mx, My in the X direction and the Y direction of the change ratio of the projection magnification β of the projection optical system PL to the values of the scalings Sx', Sy' after the correction (corrected scalings Sx', Sy'), respectively.

Subsequently, in Step 209, the wafer stage WST is driven based on the arrangement coordinates supplied from the alignment calculating system 20a under the control of the main controller 20. Further, all of the shot areas on the wafer W are exposed with the pattern image of the reticle R in accordance with the liquid immersion system via the projection optical system PL having the projection magnification corrected in Step 208.

Subsequently, in Step 210, the coordinates of the alignment marks affixed to the respective alignment shots AS of the wafer after the exposure of the kth wafer are measured by the alignment systems AL1, $AL2_1$ to $AL2_4$ in the same manner as in Step 207. The results of the measurement and the corresponding coordinate values of the wafer stage WST are supplied to the alignment calculating system 20a shown in FIG. 7. The parameters pi (Sx, Sy, θ, ω, Ox, Oy) of the expression (1) are determined from the results of the measurement by the alignment calculating system 20a.

Subsequently, in Step 211, the alignment calculating system 20a determines, with respect to the parameters (Sx, Sy, θ, ω, Ox, Oy) of the expression (1) determined in Step 207, Δpi as the fluctuation amounts (ΔSx, ΔSy, Δθ, Δω, ΔOx, Δθy) of the parameters (Sx, Sy, θ, ω, Ox, Oy) determined in Step 210. The determined Δpi is stored in the internal memory.

Subsequently, in Step 212, if the exposure is not completed for the one lot of the wafers, then the operation is returned to Step 206, and the exchange of the wafer is performed. Then, the operations of Steps 207 to 211 described above are repeated. When the exposure is completed for the one lot of the wafers in Step 212, the exposure step comes to an end.

In this procedure, for example, even when the scalings Sx, Sy are fluctuated slightly and gradually during the exposure of the kth wafer, the tendency of the fluctuation can be regarded to be approximately the same as the tendency of the fluctuation of the wafer exposed immediately before the kth wafer. In this embodiment, the parameters corrected as in the expressions (2A) to (2C) are used, and the corrected projection magnification is used. Therefore, the error of the parameter is decreased during the exposure of the wafer, and the overlay accuracy is improved.

Figure 11A:
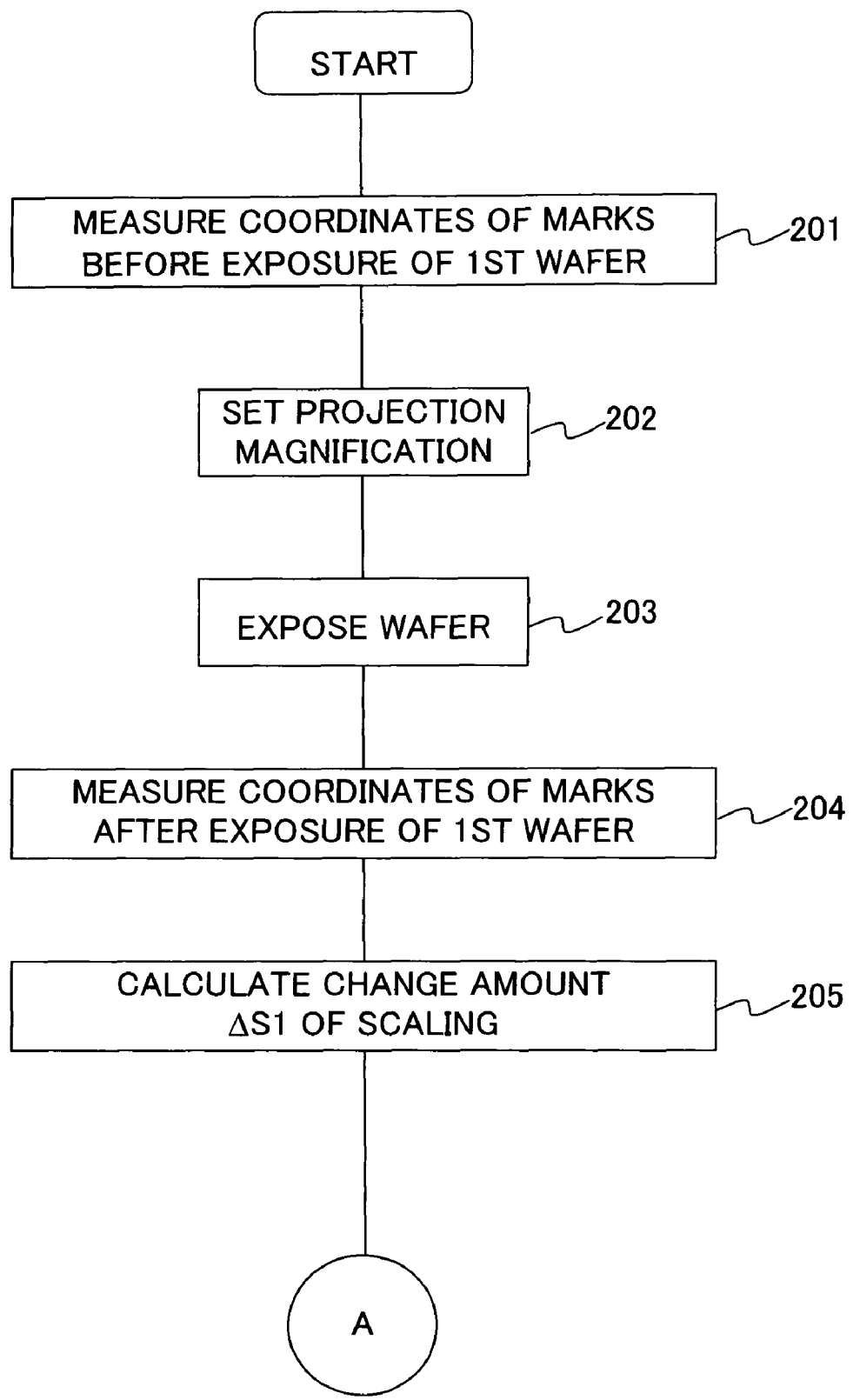
FIGS. 11A and 11B show a flow chart illustrating an example of the operation to be performed upon successively performing the exposure for one lot of wafers in the exemplary embodiment.
Figure 11B:
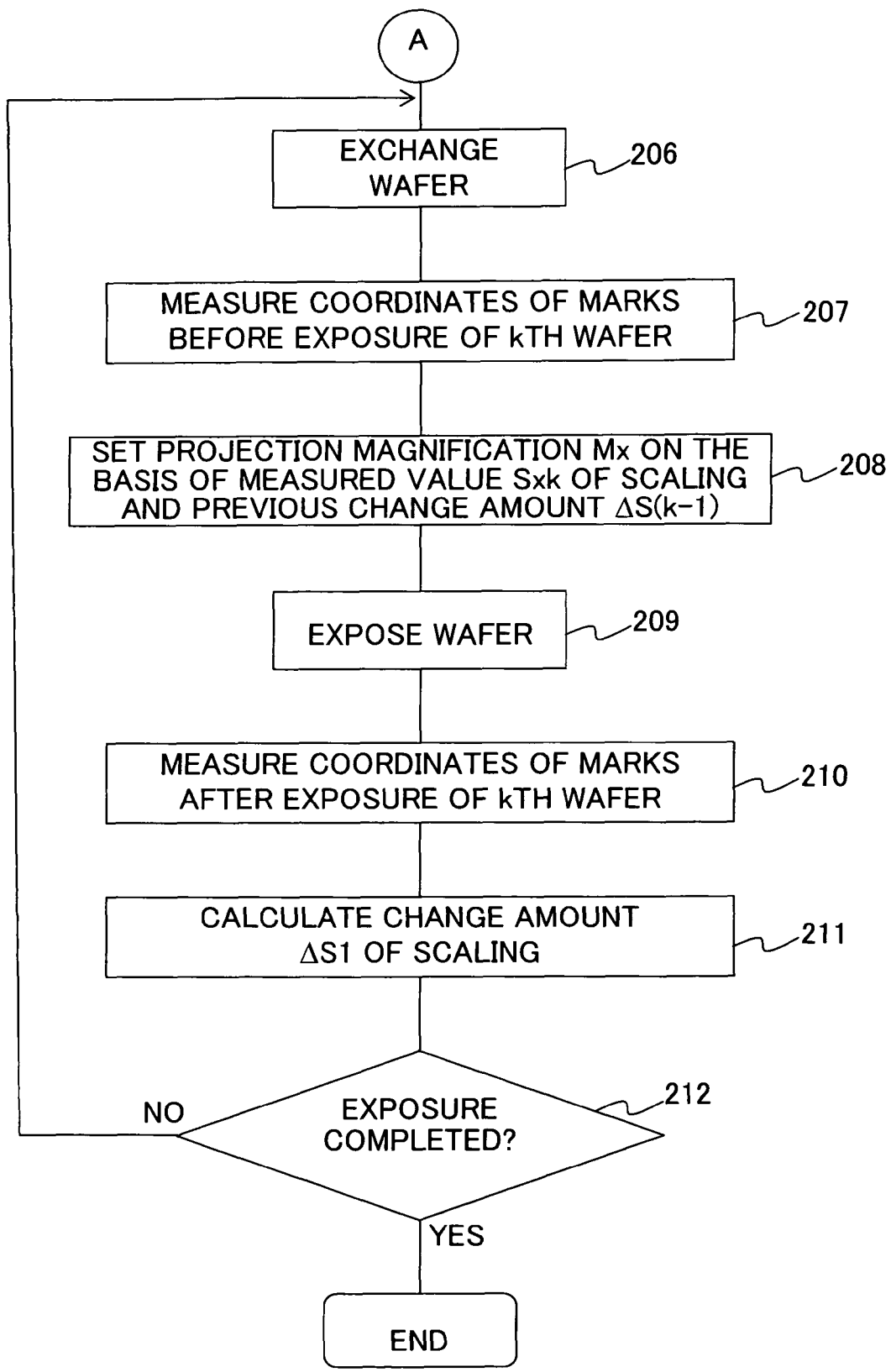
Figure 12A:
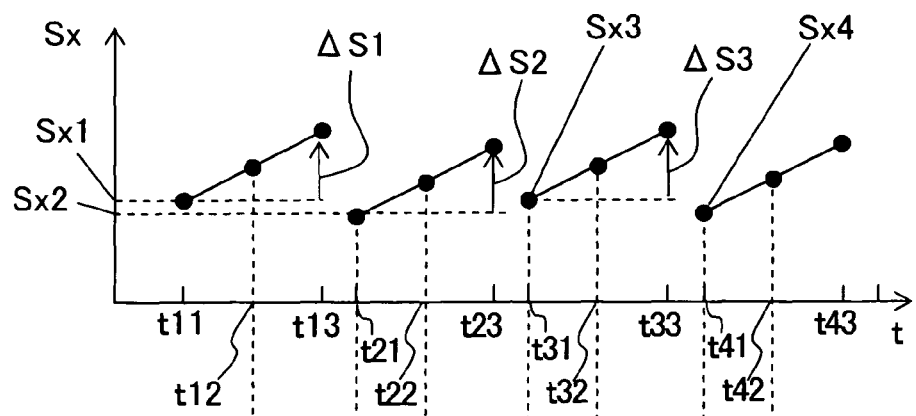
FIG. 12A shows an example of the fluctuation of the scaling Sx in the case of FIG. 11.
Figure 12B:
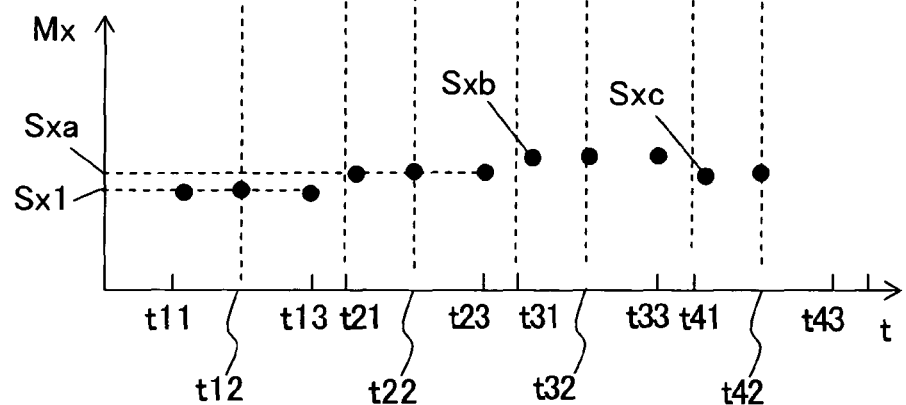
FIG. 12B shows the change of the projection magnification corresponding to FIG. 12A.

Specifically, FIG. 12A shows an example of the change of the X axis scaling Sx calculated from the measured values of the alignment systems AL1, $AL2_1$ to $AL2_4$ for the 1st to 4th wafers. FIG. 12B shows the change of the deviation Mx from the 1× magnification, of the X axis projection magnification of the projection optical system PL corrected by the operation shown in FIG. 11. In FIGS. 12A and 12B, a time point tk1 (k=1 to 4) on the horizontal axis represents the time point at which the mark measurement is completed before the exposure of the kth wafer (time point at which each of Steps 201, 207 shown in FIG. 11 is completed), a time point tk2 (k=1 to 4) represents an intermediate time point during the exposure of the kth wafer (intermediate time point in each of Steps 203, 209), and a time point tk3 (k=1 to 4) represents the time point at which the mark measurement is completed after the exposure of the kth wafer (time point at which each of Steps 204, 210 is completed).

As shown in FIG. 12A, it is assumed that the measured value of the scaling Sx of the 1st wafer before the exposure is Sx1, the fluctuation amount of the measured value after the exposure is ΔS1, and the measured value of the scaling Sx of the 2nd wafer before the exposure is Sx2. On this assumption, as shown in FIG. 12B, the deviation Mx of the projection magnification of the 1st wafer is set to Sx1, and the deviation Mx of the projection magnification of the 2nd wafer is set to Sxa (=Sx2+ΔS1/2). In the followings, it is assumed that the fluctuation amounts of the scalings Sx of the 2nd and 3rd wafers after the exposure are ΔS2, ΔS3, and the measured values of the scalings Sx of the 3rd and 4th wafers before the exposure are Sx3, Sx4. On this assumption, as shown in FIG. 12B, the deviation Mx of the projection magnification of the 3rd wafer is set to Sxb (=Sx3+ΔS2/2), and the deviation Mx of the projection magnification of the 4th wafer is set to Sxc (=Sx4+ΔS3/2).

In this case, the fluctuation of the scaling Sx during the exposure of each of the wafers can be regarded to be approximately linear in relation to the time t as shown by solid straight lines in FIG. 12A. Therefore, as appreciated from FIGS. 12A and 12B, the deviation Mx of the projection magnification after the correction is equal to the value of the actually changed scaling Sx at each of the intermediate time points t22, t32, t42 during the exposure of the 2nd wafer and thereafter; and it is appreciated that the overlay accuracy is averagely improved during the exposure.

In the embodiment described above, the alignment marks on the wafer before the exposure as measured in Step 201 (or 207) shown in FIG. 11 are same as the alignment marks on the wafer after the exposure as measured in Step 204 (or 210). Therefore, it is possible to correctly determine the fluctuation amount of the parameter of the expression (1) to be determined.

At least one mark may be identical between the plurality of alignment marks on the wafer before the exposure as measured in Step 201 (or 207) shown in FIG. 11 and the plurality of alignment marks on the wafer after the exposure as measured in Step 204 (or 210). Also in this case, it is possible to correctly determine the fluctuation amount of the parameter of the expression (1).

However, when the number of the alignment shots AS is large as in this embodiment, it is possible to determine the parameters of the expression (1) highly accurately owing to the averaging effect. Therefore, the plurality of alignment marks to be measured before the exposure may be entirely different from the plurality of alignment marks to be measured after the exposure. It is also allowable to decrease the number of the plurality of alignment marks to be measured after the exposure. In principle, the arrangement of the alignment shots AS can be defined before and after the exposure so that the measuring time is shortened as much as possible.

During the exposure in Step 203 shown in FIG. 11, the 1st wafer W is held by the wafer table WTB (movable member) shown in FIG. 1, and the 1st wafer W is moved while being subjected to the alignment based on the results of the measurement of the mark coordinates before the exposure in Step 201 (alignment information before the exposure). The measurement of the mark coordinates after the exposure in Step 204 (alignment information after the exposure) is executed before the 1st wafer W is released from being held by the wafer table WTB, for the following reason. That is, it is possible to highly accurately measure the fluctuation amount between the alignment information before the exposure and the alignment information after the exposure in such a state that no positional deviation or shift of the wafer W arises. Further, the following reason is also affirmed. That is, the wafer W is forcibly held or retained by the wafer table WTB, for example, by the vacuum attraction as described above during the period in which the alignment and the exposure are performed; and the observation of the fluctuation of the mark coordinate of the wafer W in this state is the reflection of any external factor acting on the wafer W when the exposure is actually performed.

In this embodiment, the plurality of alignment systems AL1, AL2$_1$ to AL2$_4$ are used. For example, in Step 203 (or Step 209) shown in FIG. 11, when the exposure of the first half of the surface of the wafer is completed and then the second half of the surface is subjected to the exposure, the alignment systems AL1, AL2$_1$ to AL2$_4$ may be used to measure the positions of the alignment marks of the alignment shots AS located on the first half of the surface for which the exposure is completed. In this case, for example, the exposure is started from the shot area positioned on the lower-left portion or the lower-right portion of the wafer W shown in FIGS. 10A and 10B. This makes it possible to perform the detection operation of the alignment marks located at the lower half portion of the wafer for which the exposure has been completed, concurrently with the exposure operation for the shot areas located at the upper half portion of the wafer. When the exposure and the operation for measuring the alignment information are concurrently executed at least partially, it is enough in Step 204 (or Step 210) to be performed thereafter that only the positions of the alignment marks disposed on the remaining second half of the surface are measured. Therefore, the throughput is improved.

In relation to this feature, the alignment systems AL1, AL2$_1$ to AL2$_4$ of this embodiment are an image processing system. However, those usable as the alignment systems AL1, AL2$_1$ to AL2$_4$ also include an alignment system of the laser step alignment system (LSA system) in which a diffraction grating-shaped mark and a spot light are relatively scanned as disclosed, for example, in U.S. Pat. No. 5,151,750 (corresponding to Japanese Patent Application Laid-open No. 2-272305), an alignment of the laser interference system (LIA system) in which an interference light beam is received from a diffraction grating-shaped mark, and the like. For example, when the alignment system of the LSA system is used, the alignment marks in the shot areas disposed on the first half of the surface can be concurrently and easily measured during the scanning exposure for the shot areas disposed on the second half of the surface of the wafer.

In this embodiment, the plurality of alignment systems AL1, AL2$_1$ to AL2$_4$ are used, and hence the alignment marks can be simultaneously detected at a plurality of positions on the wafer as the exposure objective. Therefore, it is possible to enhance the alignment accuracy by increasing the number of the alignment shots AS, without lowering the throughput of the exposure step. Note that, however, the present invention is also applicable to any exposure apparatus provided with one alignment system for the wafer.

In this embodiment, upon performing exposure for a kth wafer, the positional information of the alignment marks, of a (k−1)th wafer, measured after the exposure, namely fluctuation amount Δpi of the EGA parameter of the (k−1)th wafer, is used to correct the EGA parameter pi of the kth wafer to thereby calculate the position of the shot areas (arrangement information) of the kth wafer. However, the method for calculating the arrangement information is not limited to this. For example, the EGA parameter pi may be used to calculate the position of the shot areas of the kth wafer, and the calculated position may be corrected based on the position information of the alignment marks of the (k−1)th wafer. Further, in the above-described embodiment, the wafer alignment is performed in the EGA system (EGA method). However, other alignment method may be used without being limited to the EGA method. Furthermore, in the above embodiment, the projection magnification of the projection optical system PL is adjusted to decrease the overlay error of the pattern image of the reticle and the shot area due to the scaling error in the wafer. However, the adjustment of the projection magnification may also correct the overlay error due to, for example, a distortion of the shot area.

In the above embodiment, upon performing the exposure for a kth wafer, the positional information of the alignment marks, of a (k−1)th wafer, measured after the exposure is used to correct (determine) the position of the shot areas of the kth wafer and the projection magnification. However, the wafer, for which the positional information of the alignment marks of the wafer is to be measured, is not limited to the (k−1)th wafer. For example, with respect to a (k+1)th wafer and wafers thereafter, the positional information in at least two wafers back to the kth wafer may be used in some cases; or it is allowable to use the positional information in at least one wafer up to the (k−1)th wafer, rather than using the positional information of the alignment marks of the kth wafer, in other cases. In particular, in the latter case, when the exposure is performed for the last wafer in a wafer lot, it is allowable that not all of the remaining wafers, which are different from the last wafer in the wafer lot and are exposed before the last wafer, is subjected to the measurement of the positional information of the alignment marks after the remaining wafers have been exposed. Namely, the measurement of the alignment mark may be performed for only a part of the remaining wafer other than the last wafer. In this case, the positional information of the alignment marks may be measured for every other wafer or every some pieces of wafers; and the number of wafer for which the positional information is not measured may be changed. Note that in any of these cases, it is preferable that the leading wafer (first wafer) in the lot is subjected to the measurement of the positional information of the alignment marks. Further, in the above embodiment, the positional information of the alignment marks of the (k−1)th wafer may be used in each of the kth wafer and wafers thereafter.

In the embodiment described above, the fluctuation amounts of the parameter of the alignment based on the EGA system before and after the exposure of the wafer are determined, and the fluctuation amounts are used to correct the parameters of another wafer to be exposed thereafter. However, together with this process or distinctly from this process, it is also allowable to measure the fluctuation amounts of the measured values of the alignment systems AL1, AL2$_1$ to AL2$_4$ caused, for example, by the drift and the baseline amounts of the alignment systems AL1, AL2$_1$ to AL2$_4$ before and after the exposure of the wafer (positional relationship between the image of the reticle pattern and the alignment system) so that the fluctuation amounts are used to perform, for example, the correction of the offset of the EGA parameter during the exposure of a wafer to be performed thereafter. By adopting this procedure, it is also possible to improve the overlay accuracy.

For example, by scanning the image of the line-and-space pattern while changing the position of the wafer W in the Z direction with the slit pattern SL for measuring the spatial image shown in FIG. 5A, it is possible to determine the base focus position of the projection optical system PL (a kind of the alignment information in this embodiment). Accordingly, the defocus amount can be averagely decreased by determining the best focus positions before and after the exposure of the wafer to determine the fluctuation amount, and by adjusting the exposure surface of the wafer to a position obtained by adding ½ of the fluctuation amount to the best focus position determined before the exposure of the next wafer.

In the embodiment described above, the parameters after the correction are commonly determined for all of the shot areas of the wafer in Step 208 shown in FIG. 11. However, when it is assumed that the fluctuation of the parameter during the exposure is generated approximately linearly with respect to the time; and that the fluctuation amount of the parameter during the previous exposure of the wafer is represented by Δp, and the number of the shot areas on the wafer is represented by K; then it is also allowable that the correction amount of the parameter is j●Δp/K for the jth (j=1 to K) shot area of the wafer to be exposed at present. Accordingly, it is possible to maximally decrease the overlay error for all of the shot areas on the wafer.

It is also allowable to use encoder systems disclosed, for example, in International Publication No. 2007/083758 (corresponding to U.S. patent application Ser. No. 11/655,082) and International Publication No. 2007/097379 (corresponding to U.S. patent application Ser. No. 11/708,533) in place of or in addition to the encoder system used in the embodiment described above. In the embodiment described above, although the four head units 62A to 62D of the encoder system are fixed to the main frame which holds the projection unit PU, and the X scales and the Y scales are provided on the wafer table WTB, the construction is not limited to this. The head units 62A to 62D may be provided on the wafer table WTB, and the X scales and the Y scales may be provided on the main frame or any other portion. For example, as disclosed, for example, in United States Patent Application Publication No. 2006/0227309, it is also allowable to use an encoder system in which an encoder head is provided on a substrate table, and a scale is arranged at a position over or above the substrate table.

In the embodiment described above, the explanation has been made as exemplified by the exposure apparatus provided with the wafer stage and the measuring stage. Such an exposure apparatus is also disclosed, for example, International Publication No. 1999/23692 and U.S. Pat. No. 6,897,963. The contents of U.S. Pat. No. 6,897,963, etc. are incorporated herein by reference within a range of permission of the domestic laws and ordinances of the designated state and the selected state.

The present invention is also applicable to an exposure apparatus of the multi-stage type (twin-stage type) provided with a plurality of (two) substrate stages which are movable while holding a substrate P. In the case of the multi-stage type exposure apparatus, a first substrate stage which is movable while holding a substrate (wafer) and a second substrate stage which is movable while holding a substrate (wafer) can be moved to the exposure station and the measuring station independently from each other. The measurement of the position information before and after the exposure of the substrate in the present invention can be performed in the measuring station. The multi-stage type exposure apparatus as described above is disclosed, for example, in U.S. Pat. Nos. 6,590,634, 5,969,441, 5,815,246, 6,674,510, 5,969,081, 6,208,407, 6,710,849, 6,341,007, 6,400,441, 6,549,269, and 6,590,634, contents of which are incorporated herein by reference within a range of permission of the domestic laws and ordinances of the designated state or the selected state.

The liquid Lq is water in the embodiment of the present invention. However, the liquid Lq may be any liquid other than water. For example, when the light source of the illumination light IL is the $F_2$ laser (wavelength: 157 nm), those preferably usable as the liquid Lq may include, for example, fluorine-based fluids such as fluorine-based oil and perfluoropolyether (PFPE) through which the $F_2$ laser beam is transmissive. Alternatively, other than the above, it is also possible to use, as the liquid Lq, those which have the transmittance with respect to the illumination light IL, which have the refractive index as high as possible, and which are stable against the projection optical system PL and the resist with which the surface of the substrate P is coated.

The projection exposure apparatus of the embodiment described above can be produced such that the exposure light source, the illumination optical system constructed of a plurality of lenses, the projection optical system and the like are incorporated into the body of the exposure apparatus and the optical adjustment is performed, the reticle stage and the wafer stage constructed of a large number of mechanical parts are attached to the body of the exposure apparatus and the wirings and the pipings are connected thereto; and the overall adjustment (for example, the electric adjustment, confirmation of the operation, etc.) is performed. It is desirable that the projection exposure apparatus is produced in a clean room in which the temperature, the cleanness and the like are managed.

Figure 13:
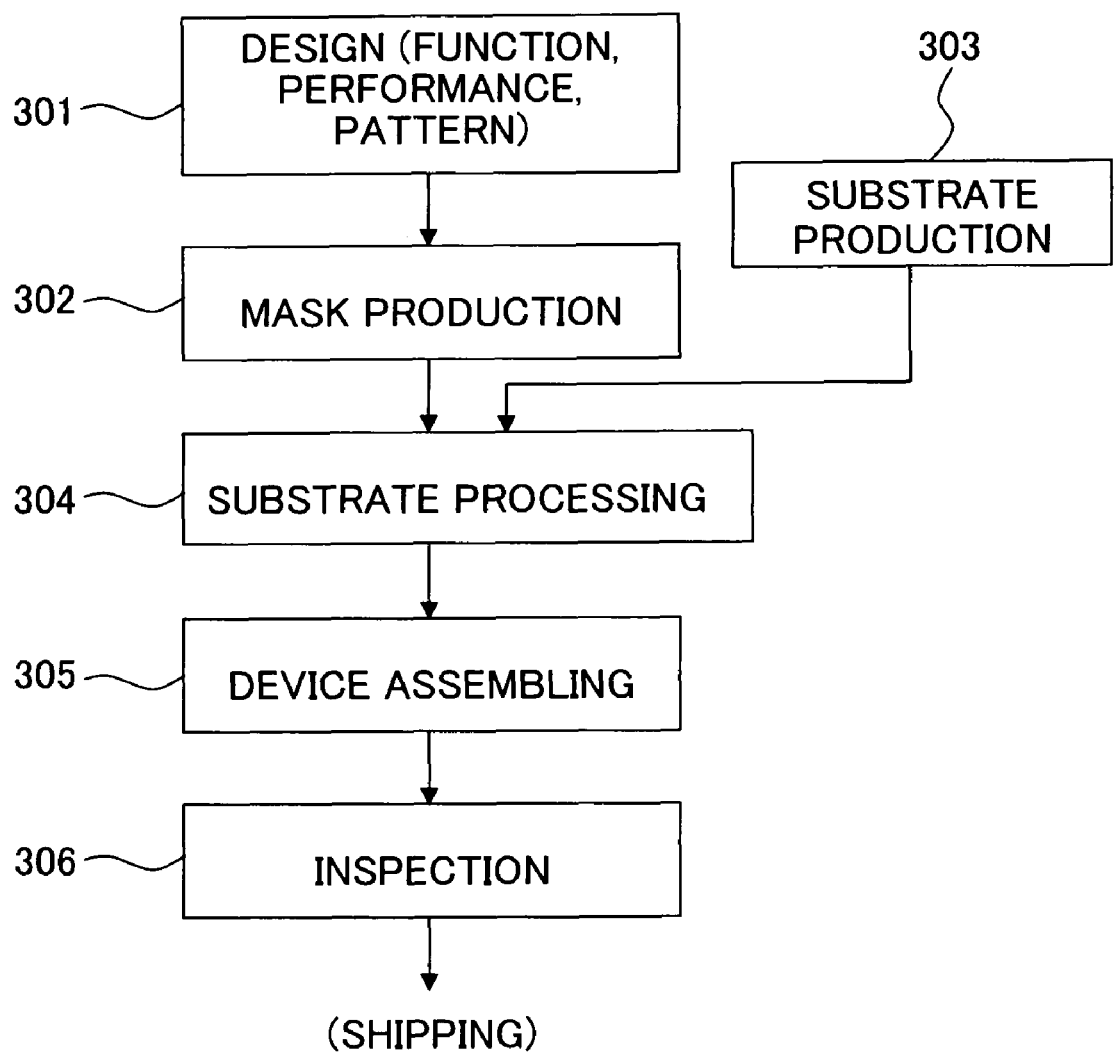
FIG. 13 shows a flow chart illustrating exemplary steps of producing a microdevice.

A microdevice such as a semiconductor device can be produced, for example, in accordance with the production process shown in FIG. 13. The microdevice is produced in accordance with the production process by performing a step 301 of designing the function and the performance of the microdevice; a step 302 of manufacturing a mask (reticle) based on the designing step; a step 303 of producing a substrate as a base material for the device; a substrate-processing step 304 including a step of exposing the substrate (wafer or the like) with the pattern of the reticle by using the exposure apparatus of the embodiment described above, a step of developing the exposed substrate, a step of heating (curing) the developed substrate, and an etching step, and the like; a step 305 of assembling (processing) the device (including a dicing step, a bonding step, and a packaging step); an inspection step; and the like.

The present invention is also applicable in a case that the alignment is performed in a projection exposure apparatus of the step-and-repeat system (stepper or the like), in addition to the scanning-type projection exposure apparatus of the step-and-scan system (scanner) described above. Further, the present invention is also applicable to an exposure apparatus (lithography system) in which the substrate P is exposed with a line-and-space pattern by forming interference fringes on the substrate P as disclosed, for example, in International Publication No. 2001/035168. Further, the present invention is also applicable, for example, to an exposure apparatus in which patterns of two masks are combined on a substrate via a projection optical system, and one shot area on the substrate is subjected to the double exposure substantially simultaneously by performing the scanning exposure once as disclosed, for example, in U.S. Pat. No. 6,611,316, contents of which is incorporated herein by reference within a range of permission of the domestic laws and ordinances of the designated state or the selected state of this international application. Further, the present invention is also applicable to an exposure apparatus of the proximity system, a mirror projection aligner, and the like. Further, the present invention is also applicable equivalently even when the alignment is performed in any exposure apparatus of the dry exposure type other than the liquid immersion type exposure apparatus.

In the embodiment described above, the reticle (mask), on which the pattern for the transfer is formed, is used. However, in place of such a reticle, as disclosed, for example, in the specification of U.S. Pat. No. 6,778,257, it is also allowable to use an electronic mask on which a transmissive pattern or a reflective pattern is formed based on the electronic data of the pattern to be subjected to the exposure (also referred to as "variable shaped mask", "active mask", or "image generator" including, for example, DMD (Digital Micro-mirror Device) as a kind of the non-light emission type image display device (spatial optical modulator)). The exposure apparatus using DMD is disclosed, for example, in Japanese Patent Application Laid-open Nos. 8-313842 and 2004-304135, etc., in addition to the U.S. Pat. No. 6,778,257. The contents of U.S. Pat. No. 6,778,257 are incorporated herein by reference within a range of permission of the domestic laws and ordinances of the designated state or the selected state.

The present invention is not limited to the exposure apparatus for the semiconductor device production. The present invention is also applicable, for example, to an exposure apparatus which transfers the device pattern onto a glass plate and which is used to produce a display including, for example, a liquid crystal display element and a plasma display; to an exposure apparatus which transfers the device pattern onto a ceramics wafer and which is used to produce a thin film magnetic head; and to an exposure apparatus which is used to produce an image pickup device (CCD or the like), an organic EL, a micromachine, MEMS (Microelectromechanical System), a DNA chip, etc. The present invention is also applicable to an exposure apparatus which transfers the circuit pattern onto a glass substrate, a silicon wafer or the like in order to produce the mask to be used for a light exposure apparatus, an EUV exposure apparatus, etc., without being limited only to the microdevice such as the semiconductor device or element.

As for various U.S. patents and U.S. patent Publications referred to in this specification, the contents thereof are incorporated herein by reference within a range of permission of the domestic laws and ordinances of the designated state or the selected state, in relation to those other than those having been specifically and explicitly incorporated herein by reference as well.

According to the exposure method and the exposure apparatus of the present invention, the fluctuation of the alignment information during the exposure of the substrate is determined, and the alignment information before the exposure of the next substrate is corrected. By doing so, it is possible to improve the overlay accuracy of the next substrate. Therefore, according to the present invention, a device, which is formed by using the lithography, can be produced extremely highly accurately, contributing to the development of the semiconductor industry.

What is claimed is:

1. An exposure method for exposing a substrate via a pattern with an exposure light by illuminating the pattern with the exposure light, the exposure method comprising:
   performing measurement of alignment information of a first substrate before and after exposure of the first substrate; and
   correcting alignment information of a second substrate before exposure of the second substrate, based on a result of the measurement,
   wherein the measurement of the alignment information of the first substrate after exposure of the first substrate is performed before development of the first substrate.

2. The exposure method according to claim 1, wherein the measurement of the alignment information of the first substrate includes detecting a mark on the first substrate.

3. The exposure method according to claim 2, wherein the mark includes a mark which is formed on the first substrate before the exposure.

4. The exposure method according to claim 1, wherein the alignment information measured each before and after the exposure of the first substrate includes position information about a plurality of marks on the first substrate, and the plurality of the marks detected after the exposure of the first substrate include at least one of the plurality of the marks detected before the exposure of the first substrate.

5. The exposure method according to claim 1, wherein
the first substrate is held by a movable member during the exposure,
the first substrate is moved based on the alignment information before the exposure, and
the alignment information measured after the exposure is measured before the first substrate is released from the movable member.

6. The exposure method according to claim 1, wherein at least a part of a measuring operation for measuring the alignment information of the first substrate and a part of a measuring operation for measuring the alignment information of the second substrate are performed concurrently with an exposure operation.

7. The exposure method according to claim 1, wherein a part of areas of the first substrate is exposed, and then an area, which is different from the part of the areas, is exposed while measuring alignment information of at least one area among the part of areas which have been exposed.

8. The exposure method according to claim 1, wherein all areas of the first substrate are exposed, and then the measurement of the alignment information after the exposure is started.

9. The exposure method according to claim 1, wherein the alignment information includes arrangement information of a plurality of areas on the first substrate, the arrangement information being obtained based on position information about a plurality of marks on the first substrate.

10. The exposure method according to claim 9, wherein the position information is obtained by detecting the plurality of marks simultaneously at a plurality of positions on the first substrate.

11. The exposure method according to claim 1, wherein the first substrate is exposed via the pattern and a projection optical system; and
the alignment information includes focus position information of the projection optical system.

12. The exposure method according to claim 1, wherein the first substrate is exposed with the exposure light via the pattern and a liquid in a liquid immersion area.

13. A method for producing a device, comprising:
exposing a substrate by using the exposure method as defined in claim 1;
developing the exposed substrate; and
processing the developed substrate.

14. An exposure method for exposing a substrate via a pattern with an exposure light by illuminating the pattern with the exposure light, the exposure method comprising:
a first step of performing measurement of alignment information of a first substrate before exposure of the first substrate;
a second step of exposing the first substrate via the pattern while performing alignment for the first substrate based on a result of the measurement in the first step;
a third step of performing measurement of alignment information of the first substrate after the exposure of the first substrate and before development of the first substrate; and
a fourth step of determining a fluctuation amount of the alignment information measured in the third step with respect to the alignment information measured in the first step.

15. The exposure method according to claim 14, further comprising:
a fifth step of determining a correction amount, with respect to the alignment information of the first substrate before the exposure, based on the fluctuation amount determined in the fourth step;
a sixth step of performing measurement of alignment information of a second substrate before the exposure of the second substrate; and
a seventh step of exposing the second substrate via the pattern while performing alignment for the second substrate based on alignment information obtained by correcting a result of the measurement performed in the sixth step using the correction amount determined in the fifth step.

16. The exposure method according to claim 15, wherein the fifth step further includes a step of adjusting the correction amount for the alignment information before the exposure depending on positions of a plurality of areas, on the second substrate, each of which is to be exposed with the pattern.

17. The exposure method according to claim 14, wherein the alignment information includes arrangement information of a plurality of areas disposed on the first substrate, the arrangement information being obtained based on a result of measurement of position information about a plurality of marks on the first substrate.

18. The exposure method according to claim 17, wherein the arrangement information is obtained by detecting the marks simultaneously at a plurality of positions on the first substrate.

19. The exposure method according to claim 17, wherein the alignment information includes information about a positional relationship between an image of the pattern to be formed via a projection optical system and an alignment system which measures the position information of the mark on the first substrate and information about a fluctuation amount of a measured value obtained by the alignment system.

20. The exposure method according to claim 14, wherein in the first step, the alignment information is measured while moving the first substrate in a predetermined direction; and in the third step, the alignment information is measured while moving the first substrate in a direction opposite to the predetermined direction.

21. The exposure method according to claim 14, wherein in the first step, the first substrate is moved in a predetermined direction while detecting marks simultaneously at a plurality of positions which are different with respect to a direction intersecting the predetermined direction.

22. The exposure method according to claim 14, wherein the first substrate is exposed via the pattern and a projection optical system; and
the alignment information includes focus position information of the projection optical system.

23. The exposure method according to claim 14, wherein in the third step, before the exposure is completed for the first substrate, the measurement of the alignment information is started.

24. The exposure method according to claim 14, wherein in the third step, after the exposure is completed for the first substrate, the measurement of the alignment information is started.

25. A method for producing a device, comprising:
exposing a substrate by using the exposure method as defined in claim 14;
developing the exposed substrate; and
processing the developed substrate.

26. An exposure method for exposing a substrate with an exposure light, the exposure method comprising:
performing exposure of a first substrate with the exposure light, and then performing detection of a mark disposed on the first substrate after the exposure and before development of the first substrate; and
performing exposure of a second substrate by using a result of the detection of the mark.

27. The exposure method according to claim 26, wherein the mark includes a mark which is formed on the first substrate before the exposure.

28. The exposure method according to claim 26, wherein the mark, which is detected after the exposure, includes at least one of a plurality of marks detected before the exposure to obtain position information used for the exposure of the first substrate.

29. The exposure method according to claim 26, wherein the first substrate is held by a movable member during the exposure; and the mark is detected before the first substrate is released from the movable member.

30. The exposure method according to claim 26, wherein a plurality of marks are detected for each of the first and second substrates before the exposure; and
a result of the detection is used during the exposure for each of the first and second substrates.

31. The exposure method according to claim 26, wherein at least a part of an operation for detecting the mark of the first substrate or the second substrate is performed concurrently with an exposure operation.

32. The exposure method according to claim 31, wherein a part of the operation for detecting the mark before the exposure is performed concurrently with the exposure operation.

33. The exposure method according to claim 31, wherein the operation for detecting the mark is started for the first substrate before the exposure operation for the first substrate is completed.

34. The exposure method according to claim 26, wherein at least one of the first substrate and the second substrate is exposed with the exposure light via a pattern and a liquid in a liquid immersion area.

35. A method for producing a device, comprising:
exposing a substrate by using the exposure method as defined in claim 26;
developing the exposed substrate; and
processing the developed substrate.

36. An exposure method for exposing a substrate with an exposure light, the exposure method comprising:
performing detection of a mark of a first substrate both before and after exposure of the first substrate with the exposure light; and
determining alignment information of a second substrate by using a result of the detection after the exposure,
wherein the detection of the mark of the first substrate after exposure of the first substrate is performed before development of the first substrate.

37. The exposure method according to claim 36, wherein a result of the detection before the exposure is also used to determine the alignment information.

38. The exposure method according to claim 36, wherein the alignment information of the second substrate is determined based on a scaling information of a scaling of the first substrate obtained from the result of the detection.

39. The exposure method according to claim 38, wherein the scaling information includes a fluctuation information of the scaling, of the first substrate, due to the exposure.

40. The exposure method according to claim 36, wherein the result of the detection is used to correct arrangement information of a plurality of areas disposed on the second substrate, the arrangement information being obtained from position information about a plurality of marks of the second substrate.

41. The exposure method according to claim 36, wherein a plurality of marks of the first substrate are detected before the exposure; and
the mark of the first substrate, which is detected after the exposure, includes at least one of the plurality of the marks of the first substrate detected before the exposure.

42. The exposure method according to claim 36, wherein the first substrate is held by a movable member during the exposure; and
the detection of the mark after the exposure is performed before the first substrate is released from the movable member.

43. The exposure method according to claim 36, wherein a plurality of marks are detected for each of the first substrate and the second substrate before the exposure of each of the first substrate and the second substrate, and a result of the detection of the marks before the exposure is used during the exposure of each of the first substrate and the second substrate.

44. The exposure method according to claim 36, wherein at least a part of a detection operation for detecting the mark of the first substrate or the second substrate is performed concurrently with an exposure operation.

45. The exposure method according to claim 44, wherein a part of the operation for detecting the mark before the exposure is performed concurrently with the exposure operation.

46. The exposure method according to claim 44, wherein the detection operation for detecting the mark of the first substrate is started before the exposure operation for the first substrate is completed.

47. The exposure method according to claim 36, wherein at least one of the first substrate and the second substrate is exposed with the exposure light via a pattern and a liquid in a liquid immersion area.

48. A method for producing a device, comprising:
exposing a substrate by using the exposure method as defined in claim 36;
developing the exposed substrate; and
processing the developed substrate.

49. An exposure apparatus which exposes a substrate via a pattern with an exposure light by illuminating the pattern with the exposure light, the exposure apparatus comprising:
a measuring device which measures alignment information of the substrate;
a controller which controls exposure of the substrate while performing alignment for the substrate based on a result of the measurement performed by the measuring device; and
a calculating device which determines a fluctuation amount of alignment information measured after exposure of a predetermined substrate and before development of the predetermined substrate by the measuring device with respect to alignment information measured before the exposure of the predetermined substrate by the measuring device.

50. The exposure apparatus according to claim 49, wherein the calculating device determines, based on the fluctuation amount, a correction amount with respect to the alignment information measured by the measuring device; and when the correction amount is determined, the controller exposes the substrate via the pattern while performing alignment for the substrate based on alignment information obtained by correcting the result of the measurement performed by the measuring device by using the correction amount.

51. The exposure apparatus according to claim 50, wherein the calculating device adjusts the correction amount of the alignment information based on the fluctuation amount, depending on positions of a plurality of areas on the substrate each of which is to be exposed with the pattern.

52. The exposure apparatus according to claim 49, wherein the measuring device includes an alignment system which detects a mark formed on the substrate.

53. The exposure apparatus according to claim 48, wherein the alignment system measures the mark simultaneously at a plurality of positions on the substrate.

54. The exposure apparatus according to claim 52, wherein the alignment information includes information about a positional relationship between the alignment system and an image of the pattern to be formed via a projection optical system and information about the fluctuation amount of a measured value obtained by the alignment system.

55. The exposure apparatus according to claim 49, wherein the substrate is exposed via the pattern and a projection optical system; and the measuring device includes a device which measures focus information of the projection optical system.

56. The exposure apparatus according to claim 49, further comprising a movable member which holds the substrate, wherein before the movable member releases holding of the substrate, the measuring device executes the measurement after the exposure of the substrate.

57. The exposure apparatus according to claim 56, wherein the measurement after the exposure of the substrate is executed on a movement route, of the movable member, at a portion of the movement route located between an exposure position at which the exposure light is irradiated and an unloading position at which the substrate is unloaded from the movable member.

58. The exposure apparatus according to claim 57, wherein the measurement before the exposure of the substrate is executed on the movement route, of the movable member, at a portion of the movement route located between the exposure position and a loading position at which the substrate is loaded into the movable member.

59. The exposure apparatus according to claim 57, wherein the measuring device (1) includes a plurality of detecting areas which are arranged at positions different with respect to a direction intersecting the predetermined direction, and (2) simultaneously detects different marks on the substrate.

60. The exposure apparatus according to claim 49, wherein the measurement before the exposure of the substrate is executed while the substrate is moved with respect to the measuring device in a predetermined direction; and the measurement after the exposure of the substrate is executed while the substrate is moved with respect to the measuring device in a direction opposite to the predetermined direction.

61. The exposure apparatus according to claim 49, wherein a liquid immersion area is formed with a liquid on the substrate during the exposure of the substrate, and the substrate is exposed with the exposure light through the liquid in the liquid immersion area.

62. An exposure apparatus which exposes a substrate with an exposure light, the exposure apparatus comprising:

a mark-detecting system which performs detection of a mark of the substrate; and a controller which controls exposure of another substrate, that is to be exposed next to the substrate, by using a result of the detection of the mark of the substrate obtained by the mark-detecting system after exposure of the substrate and before development of the substrate.

63. The exposure apparatus according to claim 62, further comprising a movable member which holds the substrate, wherein the mark-detecting system executes the detection of the mark after the exposure of the substrate before the movable member releases holding of the substrate.

64. The exposure apparatus according to claim 63, wherein the detection of the mark of the substrate after the exposure is executed on a movement route, of the movable member, at a portion of the movement route located between an exposure position at which the exposure light is irradiated and an unloading position at which the substrate is unloaded from the movable member.

65. The exposure apparatus according to claim 63, wherein the detection of the mark of the substrate is detected before the exposure of the substrate, and a result the detection of the mark before the exposure of the substrate is also used to control the exposure of the another substrate that is to be exposed next to the substrate.

66. The exposure apparatus according to claim 62, wherein the detection of the mark of the substrate is executed before the exposure of the substrate, and is executed while the substrate is moved with respect to the mark-detecting system in a predetermined direction; and the detection of the mark of the substrate after the exposure is executed while the substrate is moved with respect to the mark-detecting system in a direction opposite to the predetermined direction.

67. The exposure apparatus according to claim 62, wherein a liquid immersion area is formed with a liquid on the substrate during the exposure of the substrate, and the substrate is exposed with the exposure light through the liquid in the liquid immersion area.

68. An exposure apparatus which exposes a substrate with an exposure light, the exposure apparatus comprising:

a mark-detecting system which performs detection of a mark of the substrate; and a controller which determines alignment information of another substrate, that is to be exposed next to the substrate, by using a result of the detection of the mark of the substrate obtained each before and after the exposure by the mark-detecting system, wherein the result of the detection of the mark of the substrate obtained after the exposure is obtained before development of the substrate.

69. The exposure apparatus according to claim 68, further comprising a movable member which holds the substrate;

wherein the mark-detecting system executes the detection of the mark after the exposure of the substrate before the movable member releases holding of the substrate.

70. The exposure apparatus according to claim 69, wherein the mark-detecting system is arranged, with respect to a first direction, between an exposure position at which the exposure light is irradiated and an exchange position at which the substrate is exchanged, the mark-detecting system having a plurality of detection areas located at different positions with respect to a second direction intersecting the first direction, and simultaneously detecting a plurality of different marks on the substrate.

71. The exposure apparatus according to claim 70, wherein the detection of the mark of the substrate before the exposure is executed while the movable member is moved with respect to the mark-detecting system in the first direction; and the detection of the mark of the substrate after the exposure is executed while the movable member is moved with respect to the mark-detecting system in a direction opposite to the first direction.

72. The exposure apparatus according to claim 69, wherein a liquid immersion area is formed with a liquid on the substrate during the exposure of the substrate; and the substrate is exposed with the exposure light through the liquid in the liquid immersion area.

* * * * *